United States Patent
Ishii

(10) Patent No.: US 8,249,405 B2
(45) Date of Patent: Aug. 21, 2012

(54) VARIABLE WAVELENGTH LIGHT SOURCE, OPTICAL MODULE AND MANUFACTURING METHOD OF VARIABLE WAVELENGTH LIGHT SOURCE

(75) Inventor: Satoru Ishii, Tokyo (JP)

(73) Assignee: NEC Corporation, Tokyo (JP)

( * ) Notice: Subject to any disclaimer, the term of this patent is extended or adjusted under 35 U.S.C. 154(b) by 111 days.

(21) Appl. No.: 12/811,868

(22) PCT Filed: Jan. 28, 2009

(86) PCT No.: PCT/JP2009/051371
§ 371 (c)(1),
(2), (4) Date: Jul. 7, 2010

(87) PCT Pub. No.: WO2009/096431
PCT Pub. Date: Aug. 6, 2009

(65) Prior Publication Data
US 2010/0284649 A1 Nov. 11, 2010

(30) Foreign Application Priority Data
Feb. 1, 2008 (JP) .................................. 2008-022811

(51) Int. Cl.
*G02B 6/26* (2006.01)
*G02B 6/42* (2006.01)
(52) U.S. Cl. ........................................ 385/32; 385/42
(58) Field of Classification Search .................... 385/15, 385/31, 32, 39, 42, 47
See application file for complete search history.

(56) References Cited

U.S. PATENT DOCUMENTS

| | | | | |
|---|---|---|---|---|
| 6,567,436 B1 * | 5/2003 | Yao et al. | ......................... | 372/32 |
| 6,570,892 B1 * | 5/2003 | Lin et al. | ........................... | 372/6 |
| 6,873,631 B2 * | 3/2005 | Yao et al. | ......................... | 372/32 |
| 2003/0160148 A1 * | 8/2003 | Yao et al. | ...................... | 250/205 |

FOREIGN PATENT DOCUMENTS

| | | |
|---|---|---|
| JP | 2000028972 A | 1/2000 |
| JP | 2003233047 A | 8/2003 |
| JP | 2005026558 A | 1/2005 |
| JP | 2006201313 A | 8/2006 |
| JP | 2006245346 A | 9/2006 |

\* cited by examiner

*Primary Examiner* — Charlie Peng
*Assistant Examiner* — Mary El Shammaa

(57) ABSTRACT

The variable wavelength light source includes a multiple ring resonator including a plurality of resonators, photodetectors which detect light powers outputted from at least two out of the plurality of resonators via throughports, a plurality of variable light units for changing the transmittance of the multiple ring resonator by individually working on at least two out of the plurality of resonators, a light input/output unit which supplies the light to the multiple resonator and emits the light returned from the multiple resonator towards the outside, and a control unit which controls the plurality of variable light units in accordance with the light power detected by the photodetectors, wherein light attenuators are arranged between the throughports and the photodetectors for attenuating the light emitted from the throughports before making incident on the photodetectors.

13 Claims, 18 Drawing Sheets

VARIABLE WAVELENGTH LIGHT SOURCE, OPTICAL MODULE AND MANUFACTURING METHOD OF VARIABLE WAVELENGTH LIGHT SOURCE

This Application is the National Phase of PCT/JP2009/051371, filed Jan. 28, 2009, which claims the Priority right based on Japanese Patent Application No. 2008-022811 filed on Feb. 1, 2008, and the disclosure thereof is hereby incorporated by reference in its entirety.

BACKGROUND OF THE INVENTION

The present invention relates to a variable wavelength light source capable of changing wavelength of light by using a multiple ring resonator. More specifically, the present invention relates to enabling the variable wavelength light source to obtain output light of a more stable wavelength.

Due to the rapid growth in the Internet, particularly due to increases in use of the large-capacitance contents such as moving pictures and audios, network traffics are drastically increased these days. Wavelength Division Multiplexing (WDM) optical communication can transfer light of a plurality of wavelengths with a single optical fiber, so that it is suited for large-capacitance transmission that is required in the recent networks. Recently, there has been an increasing demand for Dense Wavelength Division Multiplexing (DWDM) communication which can transfer light of still larger number of different wavelengths.

With a WDM communication system, light sources corresponding to each wavelength are required. In accordance with increased capacitance of the networks, still larger numbers of wavelengths are required. Thus, it has become impossible to deal with such state with widely-used fixed wavelength semiconductor lasers. Therefore, a variable wavelength laser light capable of outputting a plurality of wavelengths by a single light source has been expected as a key device of the next-generation optical communication.

As the light sources for widely-used WDM communication, distributed feed-back (DFB) lasers in which diffraction grating is formed along the entire active layer as well as distributed bragg reflector (DBR) lasers in which an active region and a distributed reflector region are formed within a same element have been used frequently. However, the variable wavelength range of the DFB laser is within 3 nm and the variable wavelength range of the DBR is within 10 nm, which are insufficient to be actually applied to a WDM device.

A Sampled-Grating-DBR laser that is obtained by modifying the DBR laser and by disposing a structure in which the diffraction grating cycle is changed periodically can perform variable wavelength operations of the order of several tens of nm by using Vernier effect. However, with the DBR laser in which the active region and the distributed reflector region are formed within a same element, the element size is increased essentially. Thus, it is necessary to go through complicated manufacture steps. Further, long-term electric current impregnation causes defects in the distribute reflector region, so that the proportion of the refractive index fluctuation for the impregnated electric current changes greatly. Therefore, it is extremely difficult to secure the long-term reliability. As described, many variable wavelength semiconductor lasers have been proposed so far. However, those lasers still have many issues to overcome, and it is difficult to put them into practical use.

FIG. 18 is a conceptual chart showing the structure of a variable wavelength laser light source 300 which utilizes the ring resonator depicted in Patent Document 1. With the variable wavelength laser shown in FIG. 18, light oscillated by an SOA (semiconductor optical amplifier) 321 is inputted to ring resonators 301-302, which is reflected by a loop mirror 322 at the terminal end to return to the SOA 321, and is outputted.

At that time, heaters 311-312 attached to the ring resonators 301-202 are turned on to change the temperature of ring waveguides so as to change the effective refractive index. Thereby, the output light can be tuned to a desired wavelength. Thus, long-term property change is insignificant compared to the control method which directly impregnates the electric current. Further, through the use of the ring resonators with slightly different resonance circumference set in a plurality of stages, the resonance peak wavelength of 1 nm interval in a single resonance resonator comes to meet only with one wavelength at a wide interval of several tens of nm due to the Vernier effect.

Therefore, an extremely fine single mode oscillation can be implemented with this wavelength, and the oscillation wavelength can be selected by controlling the heater power of each ring. The variable wavelength laser light using such PLC (Planer Lightwave Circuit) element and SOA is superior in terms of the characteristics and productivity compared to other variable wavelength lasers, and future developments are expected.

In addition, as a patent document related to the variable wavelength light source, Patent Document 2 discloses a technique which attenuates monitor light to an appropriate intensity in an optical waveguide just before a monitoring light-receiving element.

Patent Document 1: Japanese Unexamined Patent Publication 2006-245346
Patent Document 2: Japanese Unexamined Patent Publication 2003-233047

However, the variable wavelength laser formed with a plurality of stages of ring resonators shown in FIG. 18 first determines the ring having the resonance circumference corresponding to ITU (International Telecommunication Union) to be the basis for deciding the oscillation wavelength, and the resonance peak wavelength of the other ring resonator whose resonance circumference length is slightly different is tuned to be the same as the resonance peak wavelength of the reference ring by adjusting the heater power. If the resonance peaks of each ring cannot be adjusted accurately, divergence from the reference ring wavelength and mode jumping (wavelength jumping) are generated.

An object of the present invention is to provide a variable wavelength light source, an optical module, and a manufacturing method of the variable wavelength light source, with which a stable output light wavelength can be acquired without having wavelength jumping and from which unintentional high output power light is not emitted.

SUMMARY OF THE INVENTION

In order to achieve the foregoing object, the variable wavelength light source according to the present invention is a variable wavelength light source which includes: a multiple resonator including a plurality of ring resonators whose outputs are drop ports and throughports, which have different optical path lengths from each other and are coupled mutually; a plurality of photodetectors which detect light powers outputted via the respective throughports of the plurality of ring resonators; a plurality of variable light units for changing transmittance of the multiple resonator by individually working on the plurality of resonators; a light input/output unit which supplies light to the multiple resonator and emits light returned from the multiple resonator towards outside; and a control unit which controls the plurality of variable light units based on the light powers detected by the photodetectors, wherein: the photodetectors are a plurality of light-receiving elements provided to the respective throughports of the plurality of resonators; the control unit includes a light power adding module which obtains the sum of the light powers detected by the plurality of light-receiving elements, and a variable light unit control module which control the plurality of variable light units in such a manner that the sum of the light powers obtained by the light power adding module becomes the minimum; and a light attenuator for attenuating the light outputted from the throughports before making incident on the photodetector is provided between the throughports and the photodetectors.

In order to achieve the foregoing object, the optical module according to the present invention includes: the variable wavelength light source; a thermoregulator which keeps the temperatures of the part excluding the control unit of the variable wavelength light source; a case which houses the part excluding the thermoregulator and the control unit of the variable wavelength light source; an electricity conductive unit which supplies an electric power to the part excluding the thermoregulator and the control unit of the variable wavelength light source from outside and inputs/outputs an electric signal thereto; and a light guiding unit which guides the light emitted from the variable wavelength light source towards the outside the case.

In order to achieve the foregoing object, the manufacturing method of a variable wavelength light source according to the present invention is a method for manufacturing a variable wavelength light source which includes: a multiple resonator including a plurality of ring resonators which have different optical path lengths from each other and are coupled mutually; a plurality of light-receiving elements which detect light powers outputted via respective throughports of the plurality of resonators at the respective throughports; a plurality of variable light units for changing transmittance of the multiple resonator by individually working on at least two of the plurality of resonators; and a light input/output unit which supplies light to the multiple resonator and emits light returned from the multiple resonator towards outside, the variable wavelength light source controlling the plurality of variable light units in such a manner that the sum of the light powers detected by the plurality of light-receiving elements becomes the minimum, and the method includes an inserting step which inserts a light attenuator between the throughports and the plurality of light-receiving elements for attenuating the light emitted from the throughports before making incident on the plurality of light-receiving elements.

The present invention is structured to attenuate the light emitted from the throughports before making incident on the plurality of light-receiving elements, so that there is no such phenomenon occurred that a specific throughport with an extremely large output becomes dominant in the synthesizing property. This makes it possible to acquire the stable output light wavelength without causing the wavelength jumping and to prevent the unintentional high output light from being emitted.

DETAILED DESCRIPTION

Figure 14:
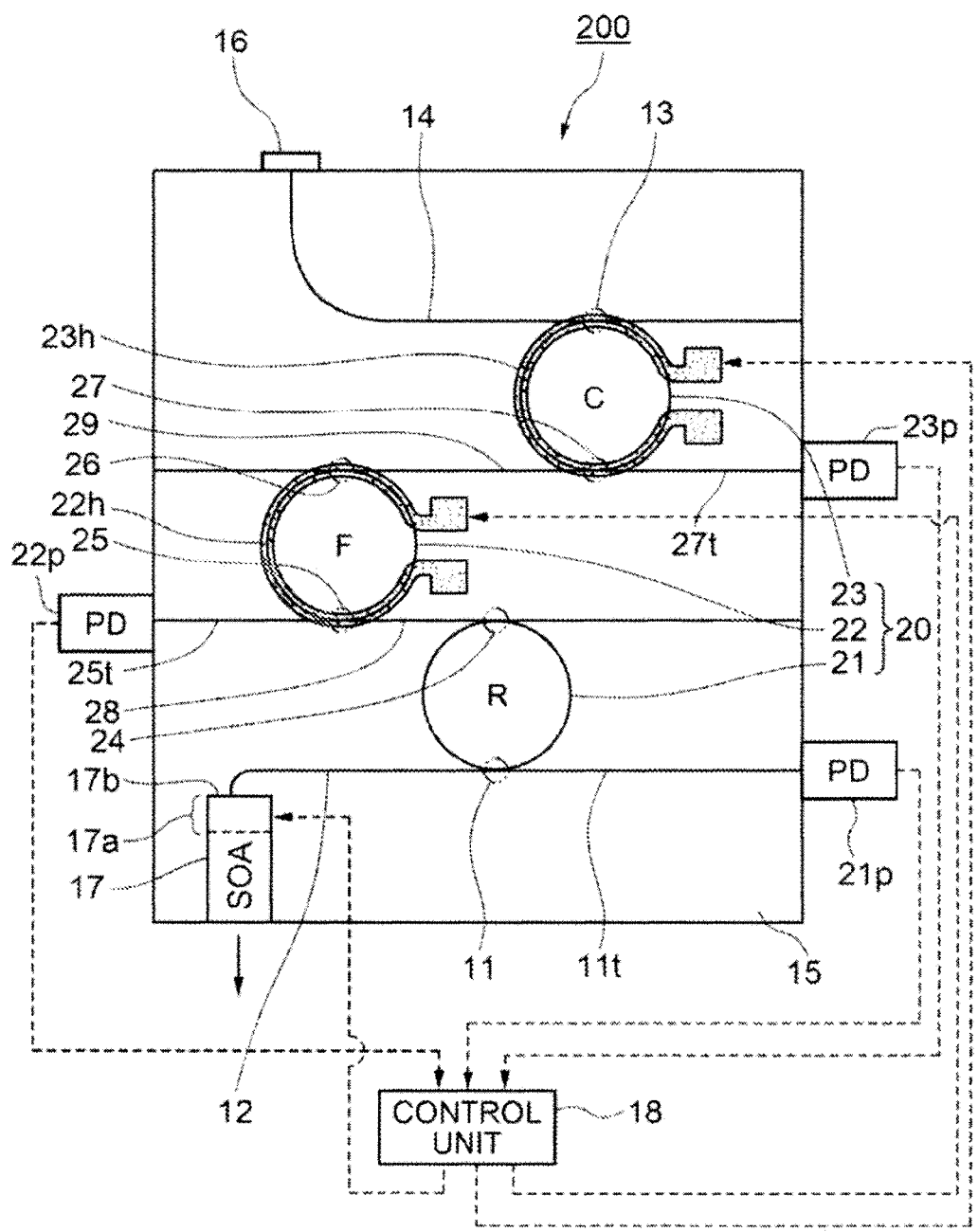
FIG. 14 is a conceptual illustration showing the structure of a variable wavelength light source that is a background of the present invention.

First, the important technique as the background of the present invention will be described. FIG. 14 is a conceptual illustration showing the structure of a variable wavelength light source 200 as the background of the present invention. With the variable wavelength light source 200, output properties of throughports of each ring resonator are monitored, and heater powers of each adjusting rings are turned on in such a manner that the total of the light output of the throughports of all the rings becomes the minimum. This makes it possible to set the condition with which the drop light of the ring resonators becomes the strongest, so that a single and long-term stable oscillation mode can be acquired.

The variable wavelength light source 200 of FIG. 14 includes: a multiple ring resonator 20 including ring resonators 21, 22, and 23, which have different optical path lengths from each other and are coupled mutually; light-receiving elements 21p, 22p, and 23p as photodetectors which detect light powers outputted from the ring resonators 21, 22, and 23 via throughports 11t, 25t, and 27t; film-type heaters 22h and 23h as a plurality of variable light units for changing the transmittance of the multiple ring resonator 20 by individually working on the ring resonators 22 and 23; an SOA 17 as a light input/output unit which supplies the light to the multiple ring resonator 20 and emits the light returned from the multiple ring resonator 20 towards the outside; and a control unit 18 which controls the heaters 22h and 23h based on the light powers detected by the light-receiving elements 21p-23p.

The light-receiving elements 21p, 22p, and 23p are provided to the throughports 11t, 25t, and 27t of the ring resonators 21, 22, and 23, respectively. The control unit 18 controls the heaters 22h and 23h in such a manner that the sum of the light powers detected by the light-receiving elements 21p-23p becomes the minimum. The light-receiving elements 21p-23p output electric signals in accordance with the light powers irradiated to the light-receiving surfaces.

The ring resonators 21-23 are formed with ring-type waveguides having different optical path lengths from each other, and coupled via directional couplers 24-27 and waveguides 28, 29. In addition to the ring resonators 21-23, the multiple ring resonators 20 includes: an input/output-side waveguide 12 whose one end is connected to the ring resonator 21 via a directional coupler 11; a reflection-side waveguide 14 whose one end is connected to the ring resonator 23 via a directional coupler 13; a PLC substrate 15 on which the ring resonators 21-23, the input/output-side waveguide 12, and the reflection-side waveguide 14 are formed; and a high-reflection film 16 provided to the other end of the reflection-side waveguide 14.

The heaters 22h and 23h are arc-form aluminum films, for example, formed on the ring resonators 22 and 23, and both ends of the arcs are electrodes for applying electricity. In other words, the heaters 22h and 23h can be formed by vapor-depositing or attaching a metal film, for example, on the PLC substrate 15, and a material used therefore is aluminum, platinum, chrome, or the like. The heaters 22h and 23h may be of a thin film or a thick film. The SOA 17 has a phase control region 17a, and a light input/output end 17b is connected to the other end of the input/output-side waveguide 12.

A heater is also provided to the ring resonator 21 as in the case of the ring resonators 22 and 23 for adjusting the oscillation wavelength to become substantially consistent with ITU grid. However, the resonance wavelength of the ring resonator 21 is fixed as a general rule after the oscillation wavelength is roughly adjusted. Thus, the heater provided to the ring resonator 21 is not relevant directly to the adjustment of the resonance wavelength to be described later, so that an illustration and an explanation thereof are omitted.

Photodiodes are used for the light-receiving elements 21p-23p. Further, the PLC substrate 15 is provided on a Peltier element (not shown) as a temperature adjusting device. This Peltier element keeps the temperature of the PLC substrate 15 to be constant so that FSR (Free Spectral Range) of the ring resonator 21 matches with the ITU grid. The SOA 17 is coupled to the other end of the input/output-side waveguide 12 via an anti-reflection film (not shown). The high-reflection film 16 is formed by vapor-depositing or laminating a dielectric multilayer film on the side face of the PLC substrate 15, for example. Instead of the high-reflection film 16, a loop mirror or the like formed with a waveguide may be used.

The light emitted from the SOA 17 returns via a following route: the SOA 17→the input/output-side waveguide 12→the directional coupler 11→the multiple ring resonator 20→the directional coupler 13→the reflection-side waveguide 14→the high-reflection film 16→the reflection-side waveguide 14→the directional coupler 13→the multiple ring resonator 20→the directional coupler 11→the input/output-side waveguide 12→the SOA 17. This return light becomes the strongest with the resonance wavelength of the multiple ring resonator 20. The reason is that the FSR of each of the ring resonators 21-23 configuring the multiple ring resonator 20 are slightly different, so that still greater reflection occurs with the wavelength (resonance wavelength) in which periodical changes in the reflection (transmission) occurring in each of the ring resonators 21-23 match with each other.

Further, the light passing through the throughports 11t, 25t, and 27t of the directional couplers 11, 25, and 27 becomes the least with the resonance wavelength of the multiple ring resonator 20. Thus, the resonance wavelength of the multiple ring resonator 20 can be detected by detecting the light amount in the throughports 11t, 25t, and 27t with the light-receiving elements 21p-23p.

Meanwhile, the resonance wavelength, i.e., the wavelength with matched period, changes greatly depending on the circumference length and changes in the waveguide refractive index of each of the ring resonators 21-23. The waveguide refractive index can be changed by the thermooptic effect. That is, it is possible to change the resonance wavelength of the multiple ring resonator 20 through controlling the input power of the heaters 22h, 23h by utilizing the temperature property of the ring resonators 22, 23.

That is, the variable wavelength light source 200 of FIG. 14 includes the multiple ring resonator 20 formed by connecting in series the three ring resonators 21-23 with slightly different circumferences, and ingeniously utilizes the Vernier effect generated thereby.

Figure 15:
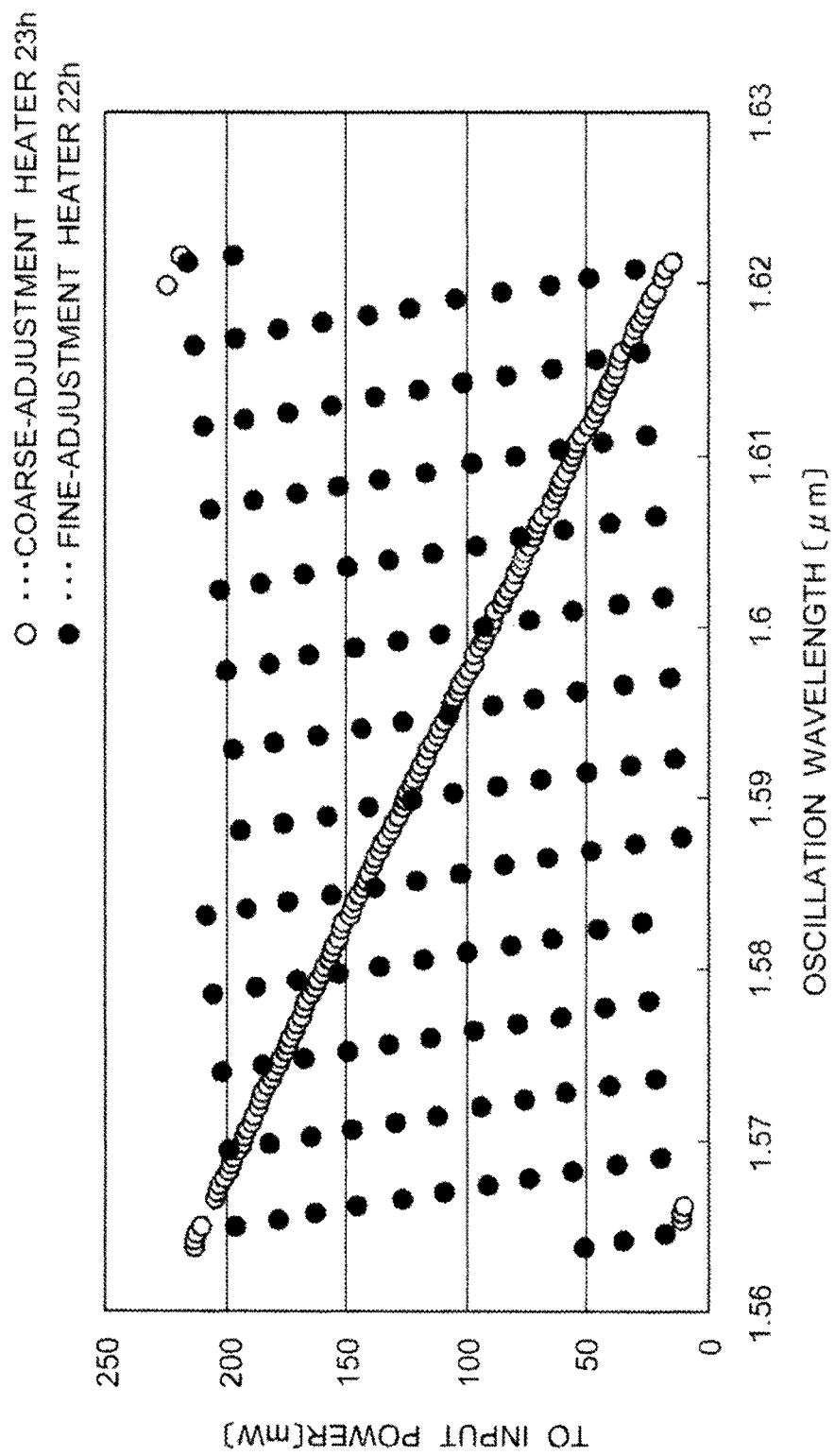
FIG. 15 is a graph showing the relation between the oscillation wavelength of the multiple ring resonator of the variable wavelength light source shown in FIG. 14 and the input power to each heater.

When the circumference length (optical path length) of the ring resonators 21-23 is set appropriately, the heater 22h operates as a variable light unit for fine adjustment while the heater 23h operates as a variable light unit for coarse adjustment. In FIG. 15, "R (Reference)" is applied to the center of the ring resonator 21 used for reference, "F (Fine)" is applied to the center of the ring resonator 22 used for fine adjustment, and "C (Coarse)" is applied to the center of the ring resonator 23 used for coarse adjustment.

The control unit 18 is formed mainly with a microcomputer such as a DSP and its program, and controls the input power to the heaters 22h and 23h in such a manner that the sum of the light powers detected by the light-receiving elements 21p-23p becomes the minimum, i.e., in such a manner that a desired resonance wavelength becomes constant. The control unit 18 also has a function of controlling the wavelength through controlling the amount of electricity supplied to the phase control region 17a. For example, wavelength control of about several tens of pm can be done by supplying electric currents to the phase control region 17a of the SOA 17.

Figure 16:
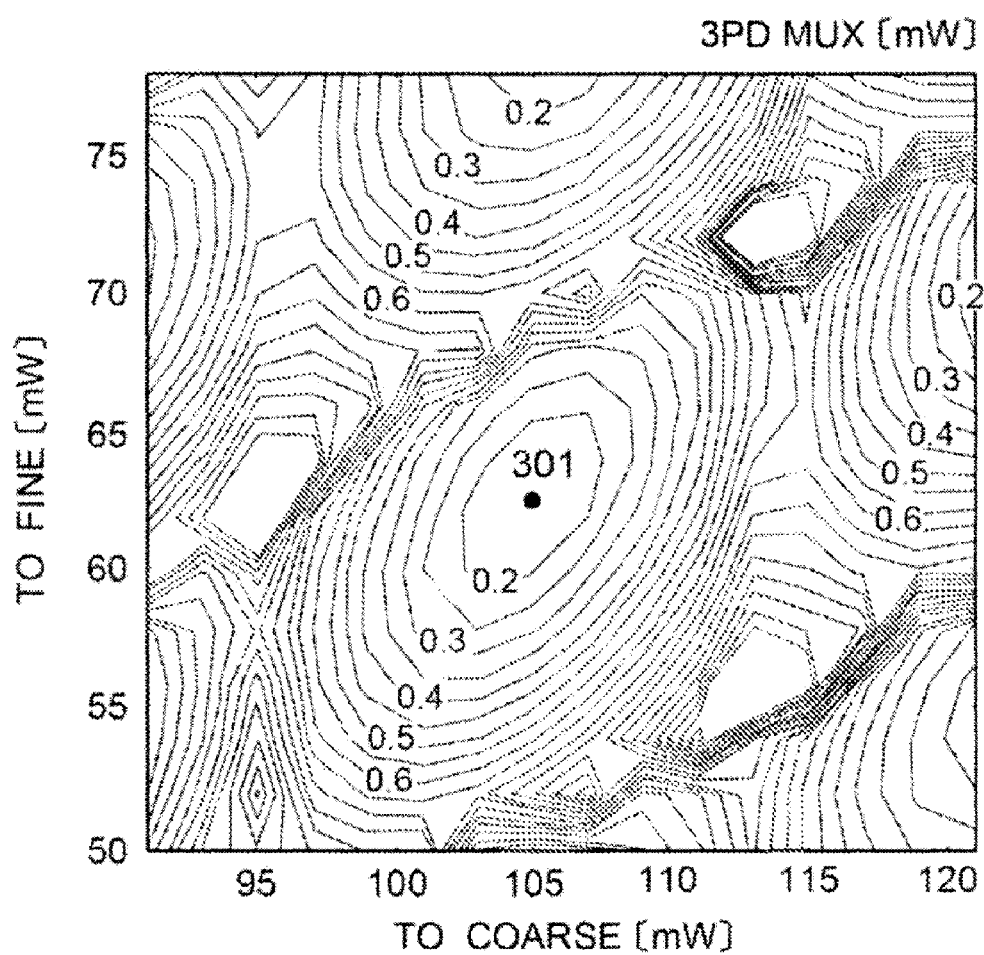
FIG. 16 is a graph (1) showing the relation between the input power to each heater of the variable wavelength light source shown in FIG. 14 and the light power of a light-receiving element.
Figure 17:
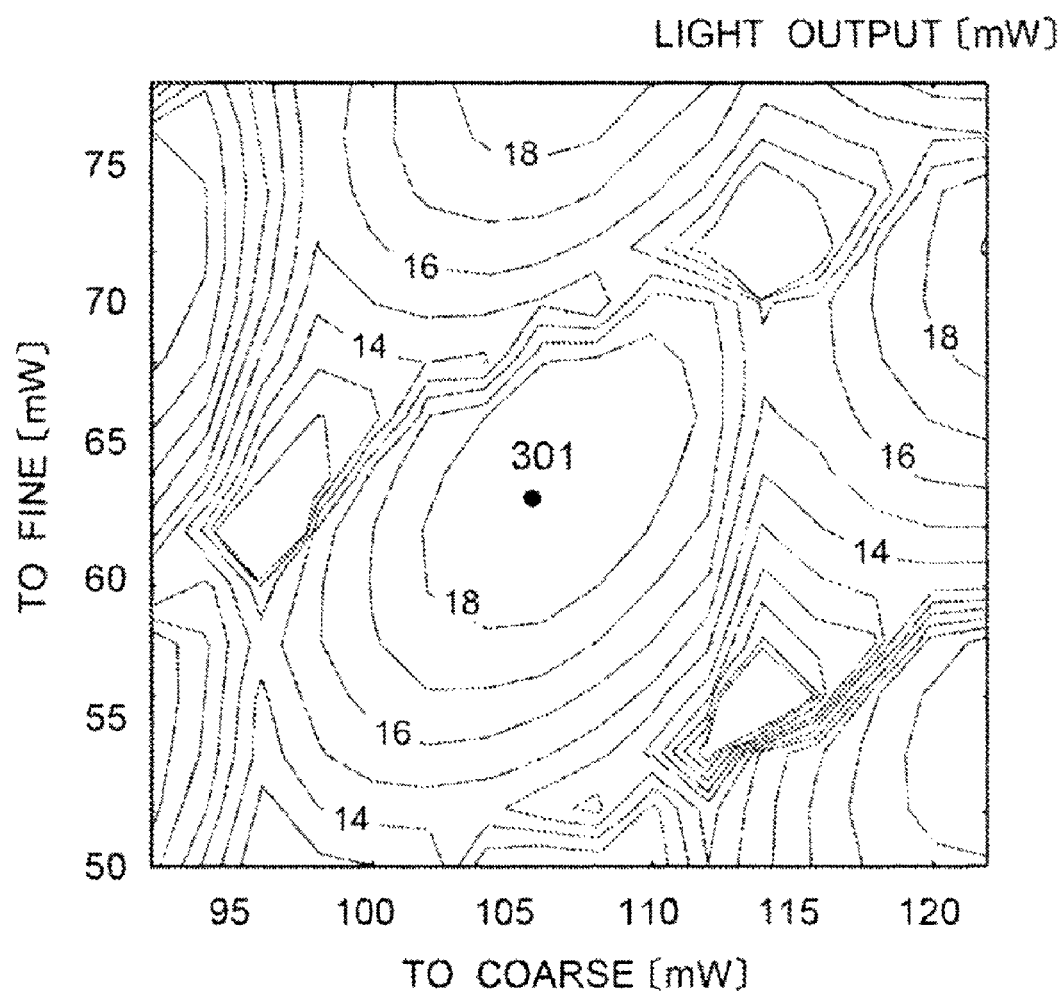
FIG. 17 is a graph (2) showing the relation between the input power to each heater of the variable wavelength light source shown in FIG. 14 and the light power of the light-receiving element.
Figure 18:
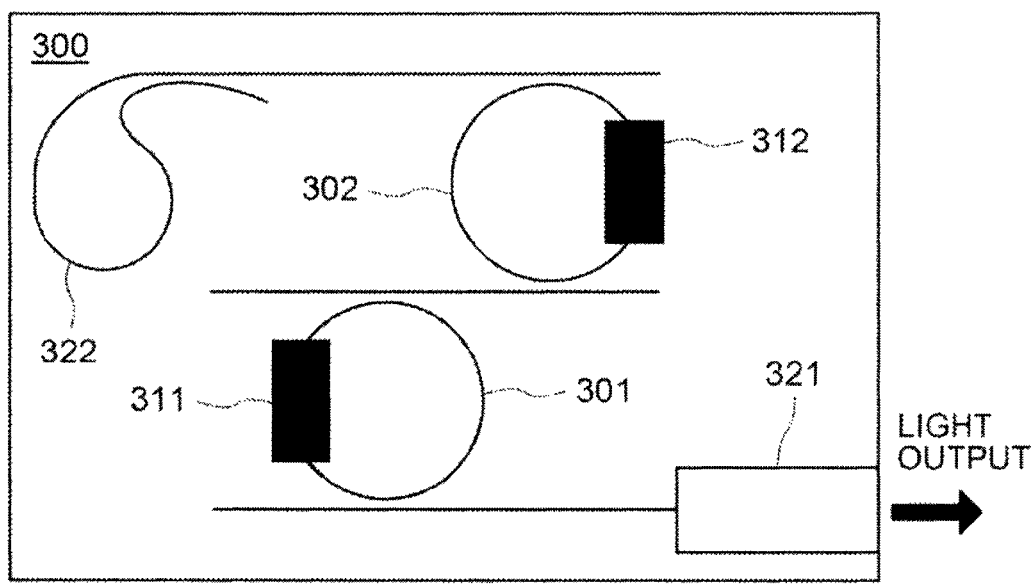
FIG. 18 is a conceptual illustration showing the structure of a variable wavelength light source according to a related technique.

FIG. 15 is a graph showing the relation between the oscillation wavelength of the multiple ring resonator 20 shown in FIG. 14 and the power inputted to each heater. FIG. 16 and FIG. 17 are graphs showing the relation between the power inputted to each heater and the light power of the light-receiving element. Each data of FIG. 16 and FIG. 17 is the data of a case where the sum of the photocurrents of the light-receiving elements 21p-23p is made to be the minimum through controlling the amount of electricity supplied to the phase control region 17a while fixing the input power to the heaters 23h an 22h to the values shown in each axis.

In FIG. 15, the lateral axis is the oscillation wavelength, the longitudinal axis is the input power, the input power to the coarse-adjustment heater 23h is shown with white circles (○), and the input power to the fine-adjustment heater 22h is shown with black circles (●). That is, FIG. 15 shows the result obtained by fixing the input power to either one of the coarse-adjustment heater 23h or the fine-adjustment heater 22h, and by changing the input power to the other. Naturally, the change in the resonance wavelength for the same input power is large in the coarse-adjustment heater 23h and small in the fine-adjustment heater 22h.

As can be seen from this graph, each wavelength channel is lined at about 18 mW interval. The amount of allowable deviation in the input power to the heaters 23h and 22h is only about 2 mW. Therefore, it is necessary to correct the deviation in the optimum input power condition generated due to various factors through determining the input power condition efficiently.

FIG. 16 and FIG. 17 show the relation between the input power to each of the heaters 22h, 23h shown in FIG. 14 and the light power of the light-receiving element, i.e., the TO (Thermo Optics Effect) tolerance characteristics at a given wavelength of the variable wavelength light source 200, and the center of the graph shows the most stable input power condition. FIG. 17 shows the value (referred to as "3PDMUX" hereinafter) obtained by converting the light outputted from the throughports 11t, 25t, 27t of the ring resonators 21, 22, 23 to electric current values at the light-receiving elements 21p, 22p, 23p and adding those values.

FIG. 17 shows the values (referred to as "light output" hereinafter) obtained by converting the light outputted to the outside the variable wavelength light source 200 from the SOA 17 into electric values at the light-receiving elements (not shown). Further, in FIG. 16 and FIG. 17, the input power to the coarse-adjustment heater 23h is shown as "TOcoarse" and the input power to the fine-adjustment heater 22h is shown as "TOfine" (the same applies hereinafter). That is, FIG. 16 and FIG. 17 show the result obtained when the coarse-adjustment heater 23h and the fine-adjustment heater 22h are controlled simultaneously.

As can be seen from those graphs, positions of the maximum point of the light output and the minimum point of 3PDMUX match with each other perfectly, and the protrusions and recesses thereof are inverted from each other. Physically, the fact that 3PDMUX is small means that the loss of the optical filter of the PLC, i.e., the loss of the multiple ring resonator 20, is small. Thus, when 3PDMUX becomes the minimum, the light output becomes the maximum. Therefore, those two optimum points match with each other. This point is called as an optimum TO point 301. The input power condition is optimized by utilizing this characteristic.

As shown in FIG. 16, the intensity of 3PDMUX forms a contour-form profile having the optimum TO point 301 as the center for TOcoarse and TOfine. There are a plurality of optimum TO points 301 in FIG. 17, and each of those shows the optimum value of a different output light wavelength. Hereinafter, a section having each optimum TO point 301 as the center is referred to as an oscillation wavelength channel.

The optimum TO point 301 is originally supposed to be in the vicinity of the center of a single oscillation wavelength channel. However, the intensity of the light output from each throughport varies depending on the layout of the ring. Thus, in a case where one of the output values of the three ports detected by the light-receiving elements 21p-23p is extremely large, the throughport whose output is extremely large becomes dominant in the synthesizing property of the throughports of all the rings. As a result, the optimum TO point 310 is deviated in the vicinity of the boundary of the other neighboring oscillation wavelength channel. This causes a phenomenon called "wavelength jumping" in which the output light wavelength is tuned to the frequency of the neighboring oscillation wavelength channel.

Further, with the variable wavelength laser of this structure controls the oscillation mode by controlling the phase of the ring resonator or the phase of the SOA. However, intended oscillation may not be obtained in some cases because the phase condition is deviated at the time of phase adjustment such as at the time of switching the oscillation wavelength, at the time of adjusting the axis of the light-receiving element to the throughport, etc. In such cases, high-output light may be emitted from the throughport, and the light-receiving element receiving the high-output light may become damaged.

Figure 1:
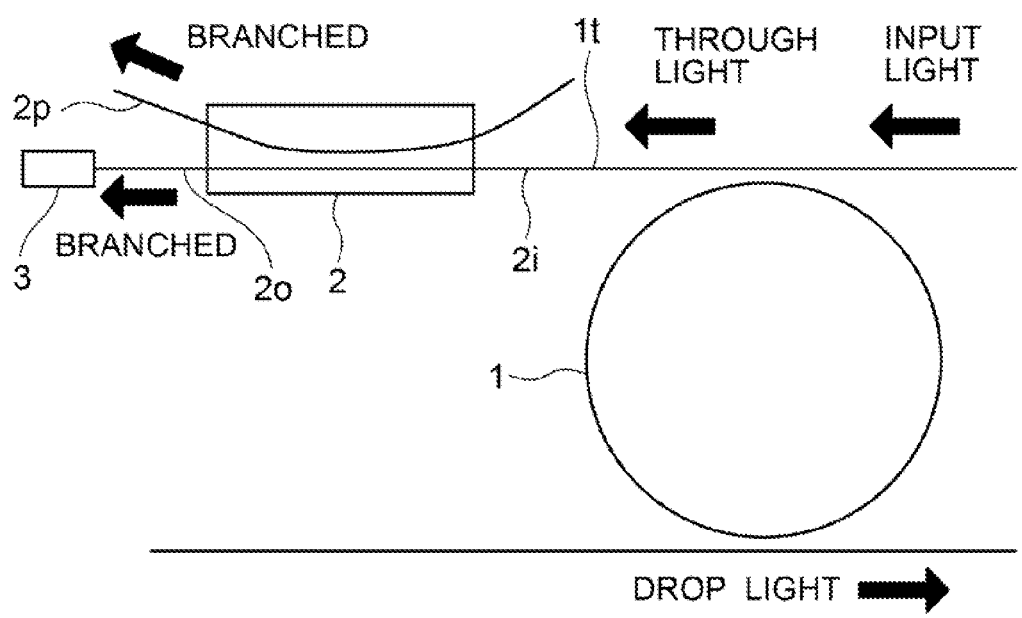
FIG. 1 is a conceptual chart showing the principle of an exemplary embodiment of the invention.

Hereinafter, the improved substance of such issues will be described. FIG. 1 is a conceptual chart showing the principle for overcoming the above-described issues. With the variable wavelength light source 200 shown in FIG. 14, the output light from the throughport of the ring resonator is directly inputted to the light-receiving element. Meanwhile, the following substance has a feature point in respect that it is structured to branch the output light from a throughport 1t of a ring resonator 1 to two-system output ends 2o, 2p by an input end 2i of a coupling waveguide 2, and to guide only one of the two-system output ends 2o, 2p to make incident on a light-receiving element 3 such as a photodiode.

Through providing such structure to all of the three ring resonators of the variable wavelength light source 200, the light output from each throughport is attenuated to uniformanize the output values of the three ports detected by the light-receiving elements 21p-23p so as to prevent the output of the one of the three ports from becoming extremely large. Thus, the phenomenon of the optimum TO point deviation does not occur, so that no wavelength jumping occurs. Further, even when the light of high-output is emitted from the throughport, the light is attenuated before making incident on the light-receiving element. Therefore, the light-receiving element is not damaged easily.

Figure 2:
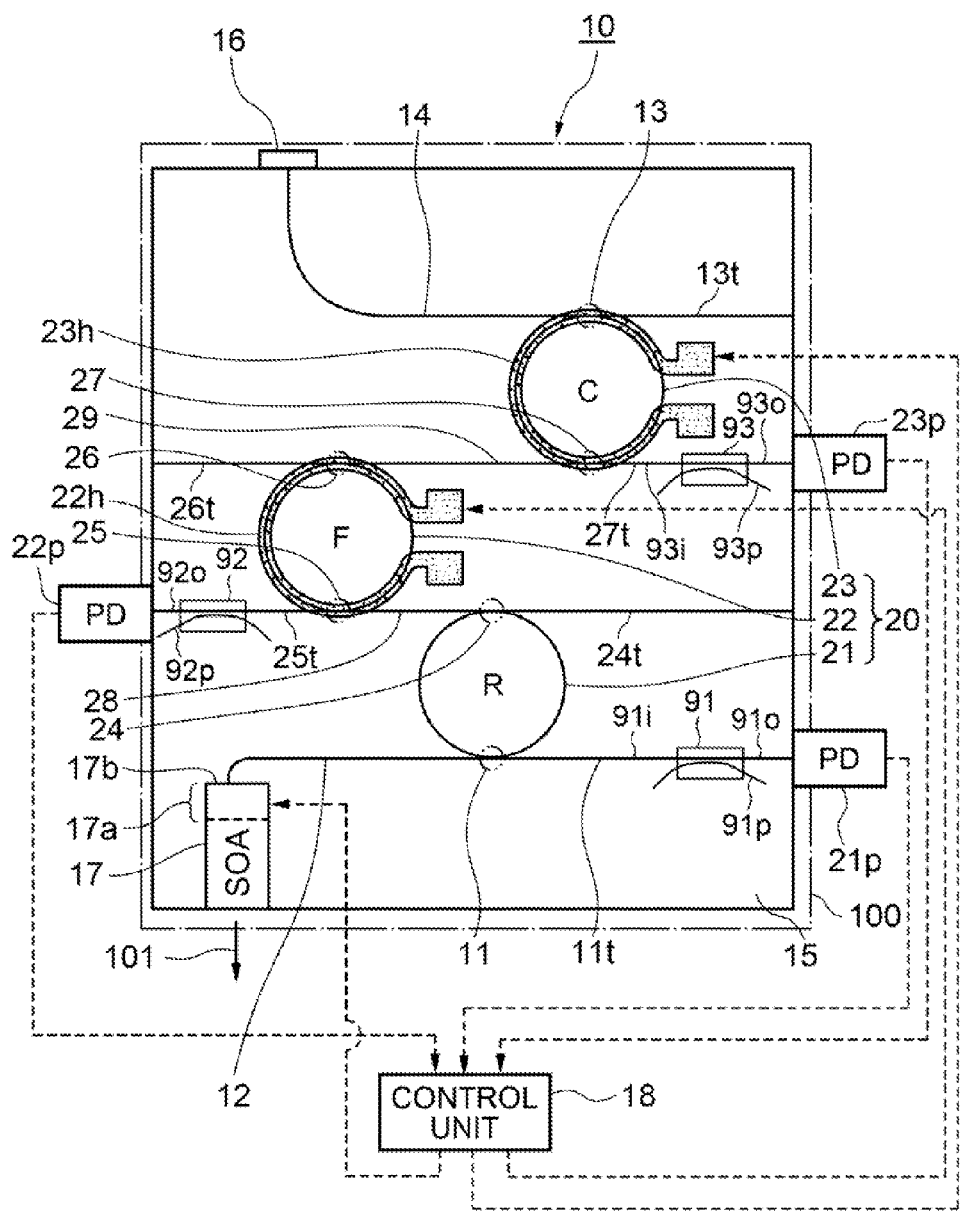
FIG. 2 is a conceptual chart showing the structure of a variable wavelength light source according to the exemplary embodiment.

FIG. 2 is a conceptual chart showing the structure of a variable wavelength light source 10 according to the exemplary embodiment. The variable wavelength light source 10 of FIG. 2 contains many structures that are in common to those of the variable wavelength light source 200 of FIG. 14. Therefore, only the difference therebetween are described herein, and explanations of the structural elements that are in common to the both are omitted by applying same reference numerals thereto.

In the variable wavelength light source 10, an input end 91i of a coupling waveguide 91 is connected to a throughport 11t of a directional coupler 11 that is provided to a ring resonator 21. Output from one of the two-system output ends, i.e., 91o, of the coupling waveguide 91 makes incident on a light-receiving element 21p. In the meantime, an input end 92i of a coupling waveguide 92 is connected to a throughport 25t of a directional coupler 25 that is provided to a ring resonator 22. Output from one of the two-system output ends, i.e., 92o, of the coupling waveguide 92 makes incident on a light-receiving element 22p. Further, an input end 93i of a coupling waveguide 93 is connected to a throughport 27t of a directional coupler 27 that is provided to a ring resonator 23. Output from one of the two-system output ends, i.e., 93o, of the coupling waveguide 93 makes incident on a light-receiving element 23p.

Each of the ring resonators 21-23 has a total of two throughports, i.e., one port in the direction (forward direction) from an SOA 17 towards a PLC substrate 15 and one in a direction (backward direction) inversely towards the SOA 17. For example, the ring resonator 21 has the throughport 11t on the forward-direction side and a throughport 24t on the backward-direction side. The ring resonator 22 has the throughport 25t on the forward-direction side and a throughport 26t on the backward-direction side. The ring resonator 23 has the throughport 27t on the forward-direction side and a throughport 13t on the backward-direction side.

Through monitoring either one of the throughports of the forward direction and backward direction, the light output making incident on the light-receiving element can be decreased. In the variable wavelength light source 10 shown in FIG. 2, the light-receiving elements 21p-23p are provided to the throughports 11t, 25t, and 27t on the forward-direction side. However, the light-receiving elements are not provided to the throughports 24t, 26t, and 13t of the backward-direction side. Further, as described earlier, the output from the throughports 11t, 25t, and 27t of the forward-direction side are guided to make incident on the coupling waveguides 91-93 so as to attenuate the output values of the ports making incident on the light-receiving elements 21p-23p further.

Note, however, that the output values of the three ports detected by the light-receiving elements 21p-23p do not have to be strictly equivalent but may only need to avoid such condition that one of those values becomes extremely large. Thus, at a stage of designing the variable wavelength light source 10, parameters such as tap ratio (branching ratio) of each of the coupling waveguides 91-93 may be determined based on evaluations and the like for test samples.

Figure 3:
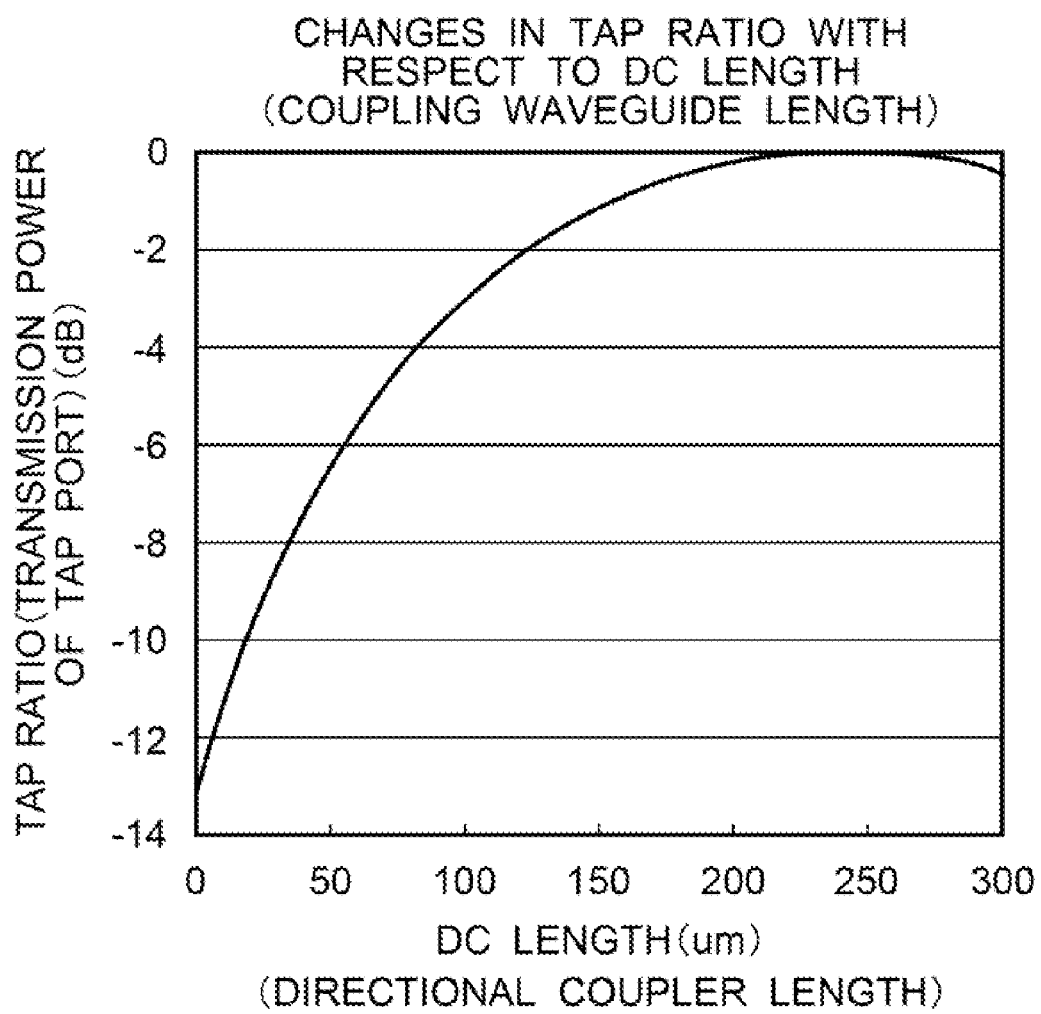
FIG. 3 is a graph showing the relation between DC length (coupling waveguide length) of a coupling waveguide shown in FIG. 2 and the tap ratio.

FIG. 3 is a graph showing the relation between DC length (coupling waveguide length) of the coupling waveguides 91-93 shown in FIG. 2 and the tap ratio. The lateral axis is the DC length and the longitudinal axis is the tap ratio. With changes in the DC length, the tap ratio can be determined as shown in FIG. 3. In the case shown in FIG. 3, the tap ratio shows the attenuation rate of the light output.

At a stage of designing the variable wavelength light source 10, the output values of each port are measured under a power condition where 3PDMUX becomes the minimum in a state where the coupling waveguides 91-93 are not inserted. The coupling waveguides 91-93 are inserted by determining tap ratio so that the output values of the other two ports are to be the same as the output value of the port whose output values is the lowest. Thereinafter, the variable wavelength light sources 10 may be manufactured based on the parameter such as the determined tap ratio.

Further, there is a possibility that the light outputted from the output ends 91p-93p of the coupling waveguides 91-93, which are on the side not making incident on the light-receiving elements 21o-23o, is mixed into the inside the PLC substrate 15 as stray light or received by one of the light-receiving elements 21p-23p. This may cause unintentional malfunctioning in the operations of the variable wavelength light source 10, so that the light outputted from the output ends 91p-93p may be released to the outside the PLC substrate 15. Similarly, the output light from the throughports 24t, 26, and 13t on the backward-direction side may be released to the outside the PLC substrate 15.

As described above, the variable wavelength light source 10 according to the exemplary embodiment is capable of acquiring a stable output wavelength without having the wavelength jumping caused due to deviation of the optimum TO point and capable of preventing damages to the light-receiving elements due to emitted unintentional high-output light through employing the output decreasing structure to the throughports of the ring resonators of the variable wavelength light source 10 formed with the ring resonators 21-23 and the SOA 17 in combination.

Figure 4A:
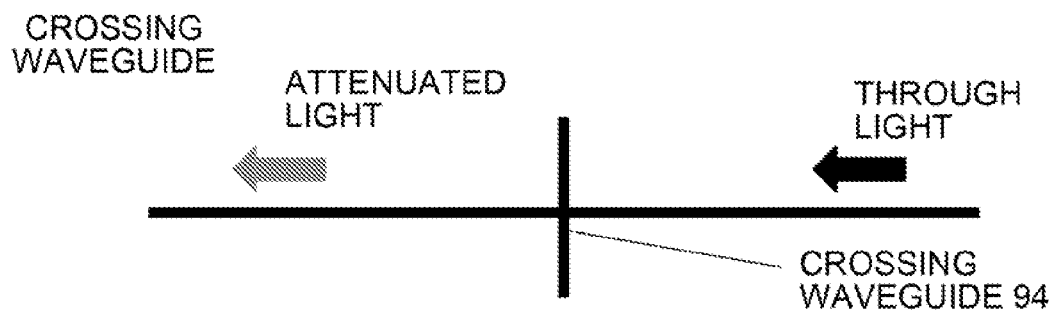
FIG. 4 is a conceptual chart showing examples of the output decreasing structure which can be used as substitutes for the coupling waveguide in the variable wavelength light source.
Figure 4B:
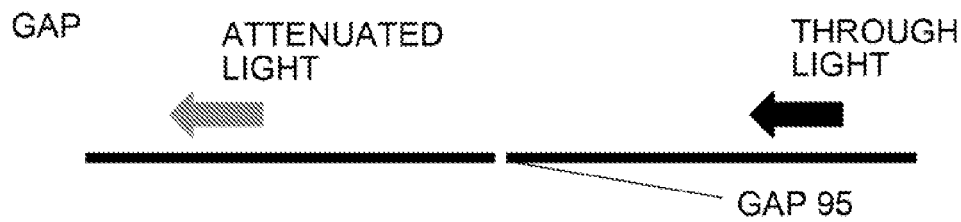
Figure 4C:
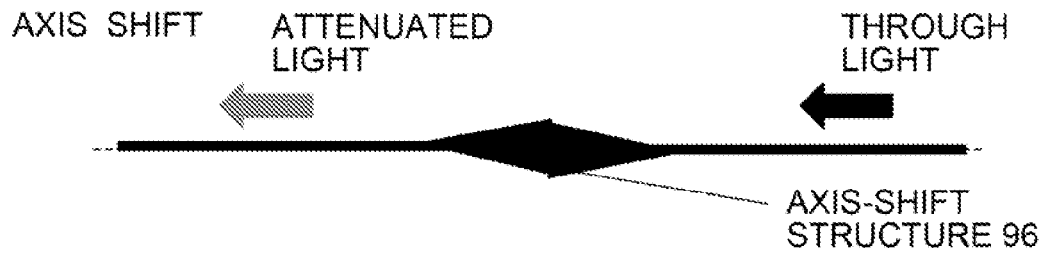

FIG. 4 is a conceptual chart showing an example of the output decreasing structure that can be used as a substitute for the coupling waveguides 91-93 of the variable wavelength light source 10 shown in FIG. 2. Any means capable of attenuating the output light from the throughports 11t, 25t, and 27t can be used as the substitute for the coupling waveguides 91-93. It is more desirable if it can be manufactured by having the attenuation amount as the parameter for designing.

More specifically, it is possible to use a crossing waveguide 94 shown in FIG. 4A, a gap 95 shown in FIG. 4B, an axis shift structure 96, or the like, for example. In a case where the axis shift structure 96 is used, the attenuation amount changes greatly with a change of a small shift amount when the axis shift is applied to a normal waveguide. Thus, this is not suited for adjustment of minute attenuation amount. Thus, a structure where the tip end of the waveguide is widened is provided for making it easy to adjust the minute attenuation amount.

The operations of the manufactured variable wavelength light source 10 are the same as those of the variable wavelength light source 200 shown in FIG. 14. Therefore, only the outline of the operations thereof is simply described hereinafter.

Figure 5:
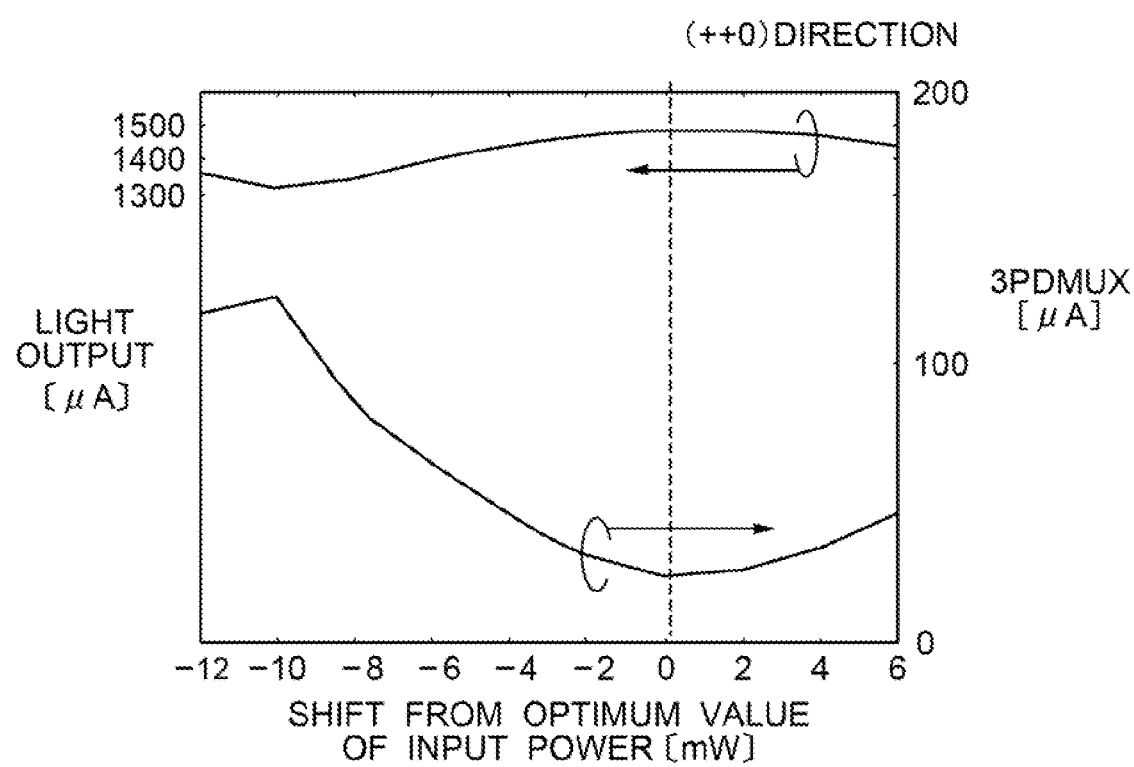
FIG. 5 is a graph (1) showing the relation regarding deviation from the optimum value of the input power to each heater of the variable wavelength light source and the light power of a light-receiving element.
Figure 6:
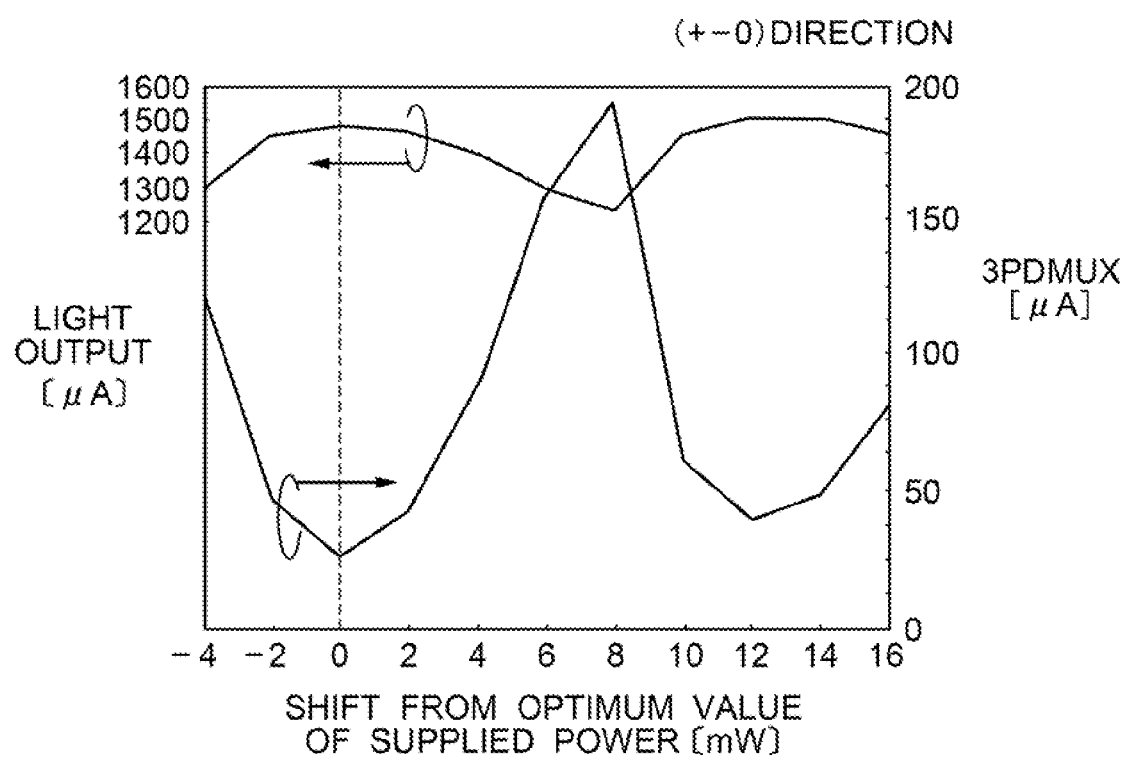
FIG. 6 is a graph (2) showing the relation regarding deviation from the optimum value of the input power to each heater of the variable wavelength light source and the light power of the light-receiving element.

FIG. 5 and FIG. 6 are the relations regarding the deviation from the optimum value of the input power to the heaters 22h, 23h shown in FIG. 2, the light output, and 3PDMUX, i.e., the results obtained by comparing the tolerance for the input power with the light output and 3PDMUX. "0" on the lateral axis in FIG. 5 and FIG. 6 is the optimum value of the input power. "(++0) direction" shown in FIG. 5 means an operation to increase and decrease the input power to the heaters 22h and 23h by the same amount. "(+−0) direction" shown in FIG. 6 means an operation to shift the input power to the heaters 22h and 23h oppositely.

As can be seen from the chart, in both "(++0) direction" and "(+−0) direction", the fluctuation rate for the input power is small with the upwardly-projected light output. Thus, the sensitivity when the input power is deviated is also small. In the meantime, with downwardly-projected 3PDMUX, the fluctuation rate for the input power is large. Thus, the sensitivity when the input power is deviated is large. Therefore, 3PDMUX is preferable for the control method. Particularly, the fluctuation rate of the light output hardly change in some cases depending on the oscillation condition, so that 3PDUMAX with which the large sensitivity can be obtained regardless of the oscillation condition is preferable for optimizing the input power.

With the variable wavelength light source 10 according to the exemplary embodiment, the light-receiving elements 21p, 22p, 23p are provided to the throughports 11t, 25t, 27t, respectively, and the sum of the light powers detected by the light-receiving elements 21p, 22p, 23p is obtained so as to obtain the sum of the powers not optically but electrically, when controlling the heaters 22h, 23h in such a manner that the sum of the light powers outputted from the throughports 11t, 25t, 27 of the ring resonators 21-23 becomes the minimum. Therefore, deterioration in the detection accuracy of the light power due to the interference can be prevented, thereby making it possible to improve the detection accuracy of the light power without increasing the size of the device, etc.

Figure 7:
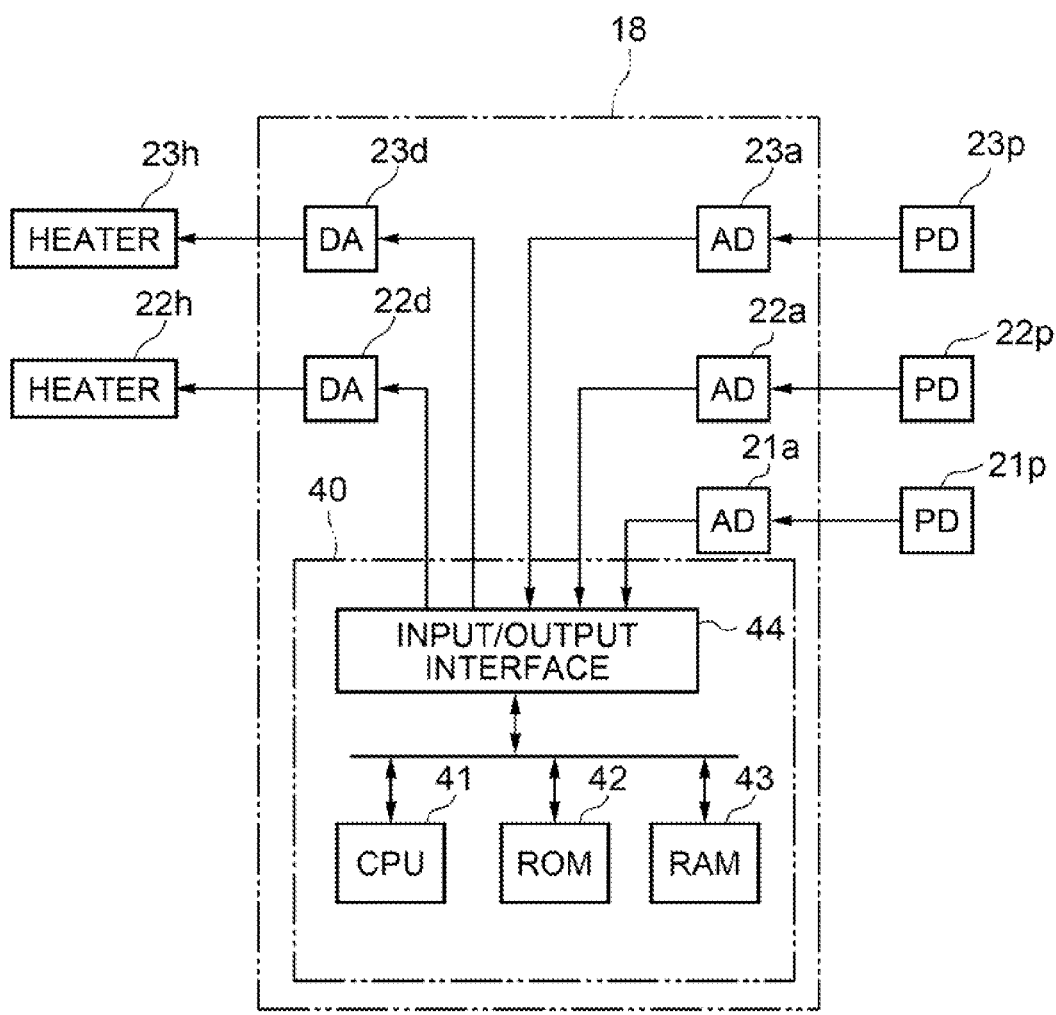
FIG. 7 is a block diagram showing an example of the hardware structure of the control unit of the variable wavelength light source shown in FIG. 2.

FIG. 7 is a block diagram showing an example of the hardware structure of the control unit of the variable wavelength light source 10 shown in FIG. 2. The control unit 18 is configured with a microcomputer 40 as a central feature; A/D converters 21a, 22a, and 23a; D/A converters 22d and 23d; and the like. The A/D converters 21a-23a convert analog signals outputted from the light-receiving elements 21p-23p into digital signals, and output those to the microcomputer 40. The D/A converters 22d, 23d also function as the drivers for the heaters 23h, 22h, and provide input power (analog signal) to the heaters 23h, 22h according to the control signal (digital signal) from the microcomputer 40.

The microcomputer 40 is a general computer such as a DSP, and includes a CPU 41, a ROM 42, a RAM 43, an input/output interface 44, and the like. The CPU 41 takes out, reads, and executes instructions of a program stored in the RAM 43. The input/output interface 44 also has a function for communicating between the CPU 41 and external computers, etc. The sum of the photocurrents as the electric signals outputted from the light-receiving elements 21p-23p is obtained by the A/D converters 21a-23a and the microcomputer 40 digitally. At the same time, the control unit 18 also has a function for controlling the phase control region 17a (FIG. 2) and a Peltier element (not shown).

Figure 8:
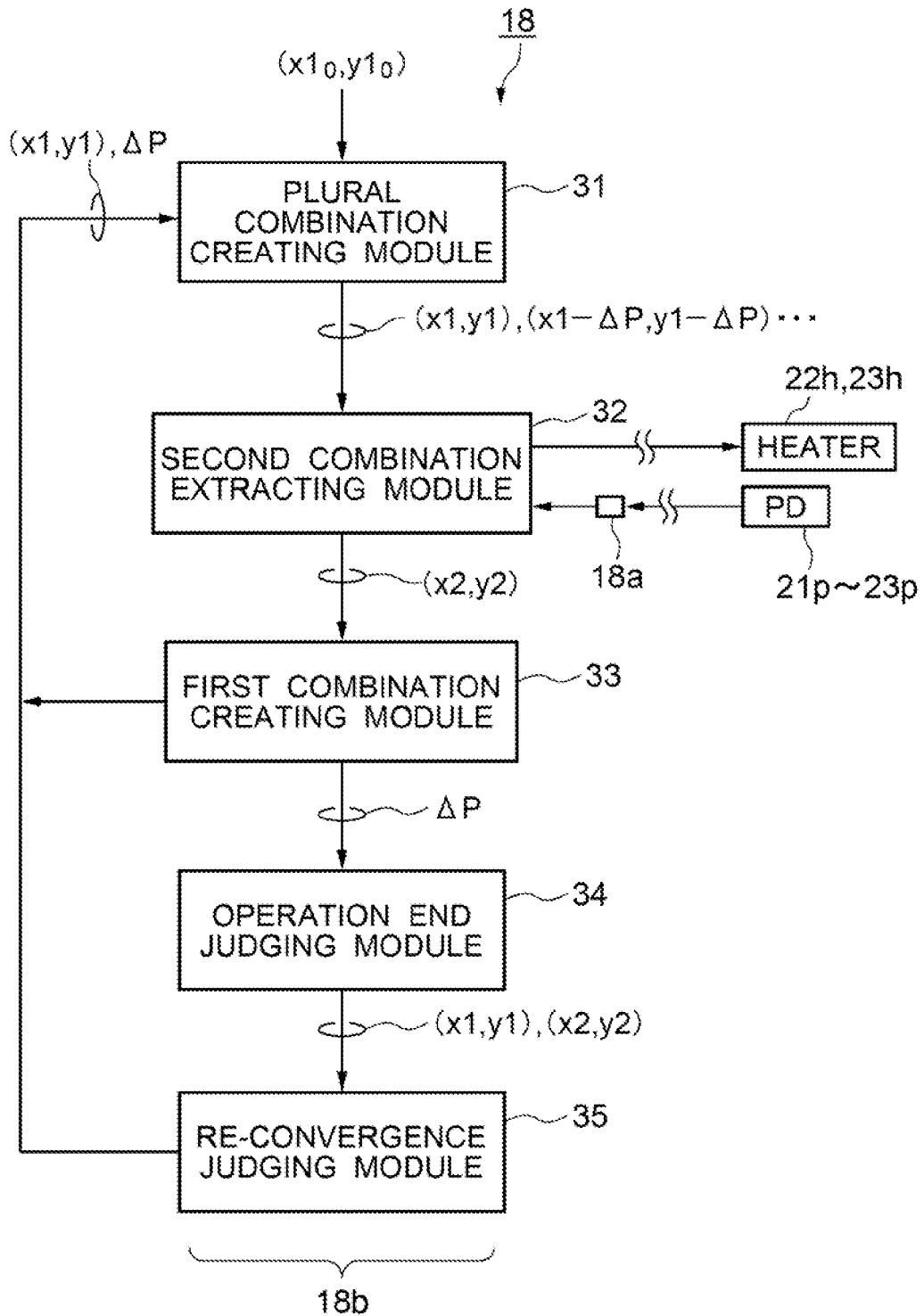
FIG. 8 is a block diagram showing an example of the functional structure of the control unit of the variable wavelength light source shown in FIG. 2.
Figure 9:
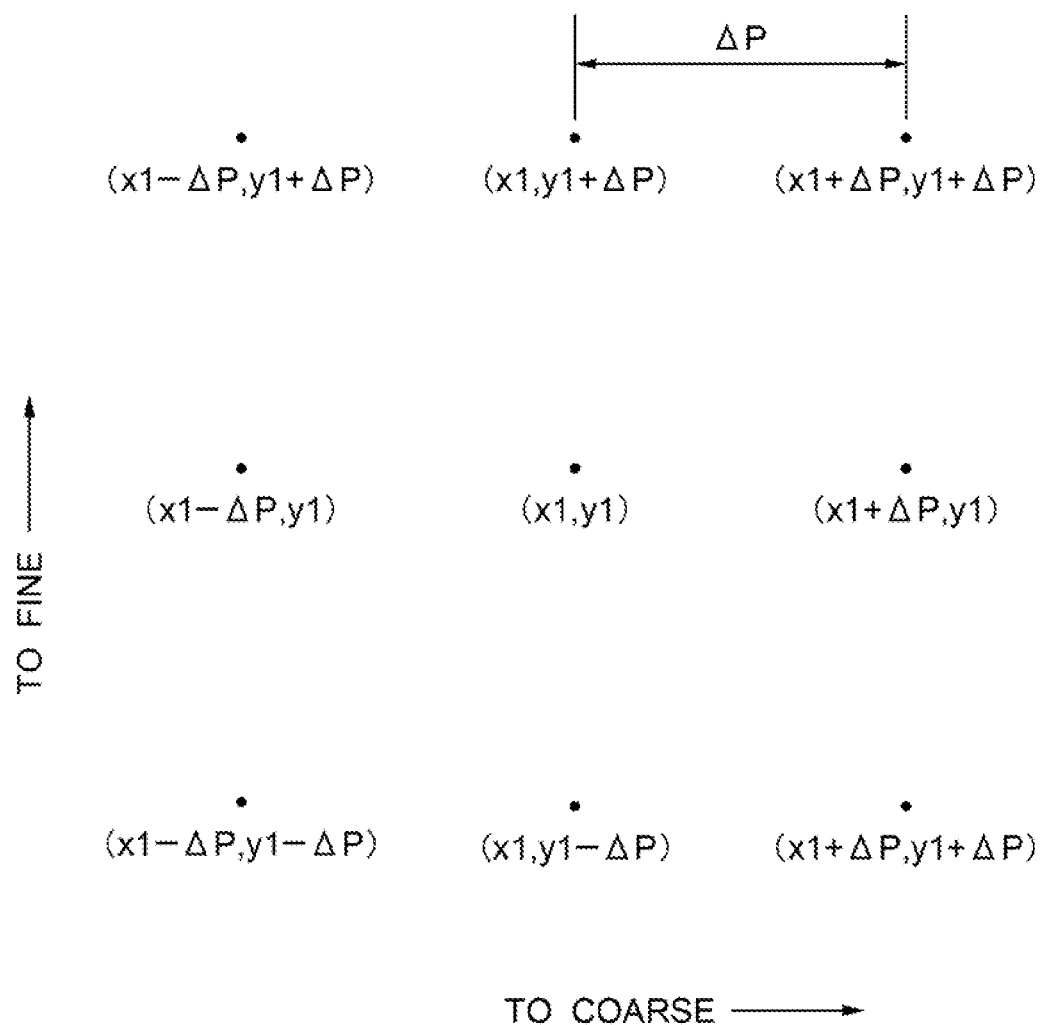
FIG. 9 is an explanatory chart showing a part of operations of a plural combination creating module shown in FIG. 8.
Figure 10:
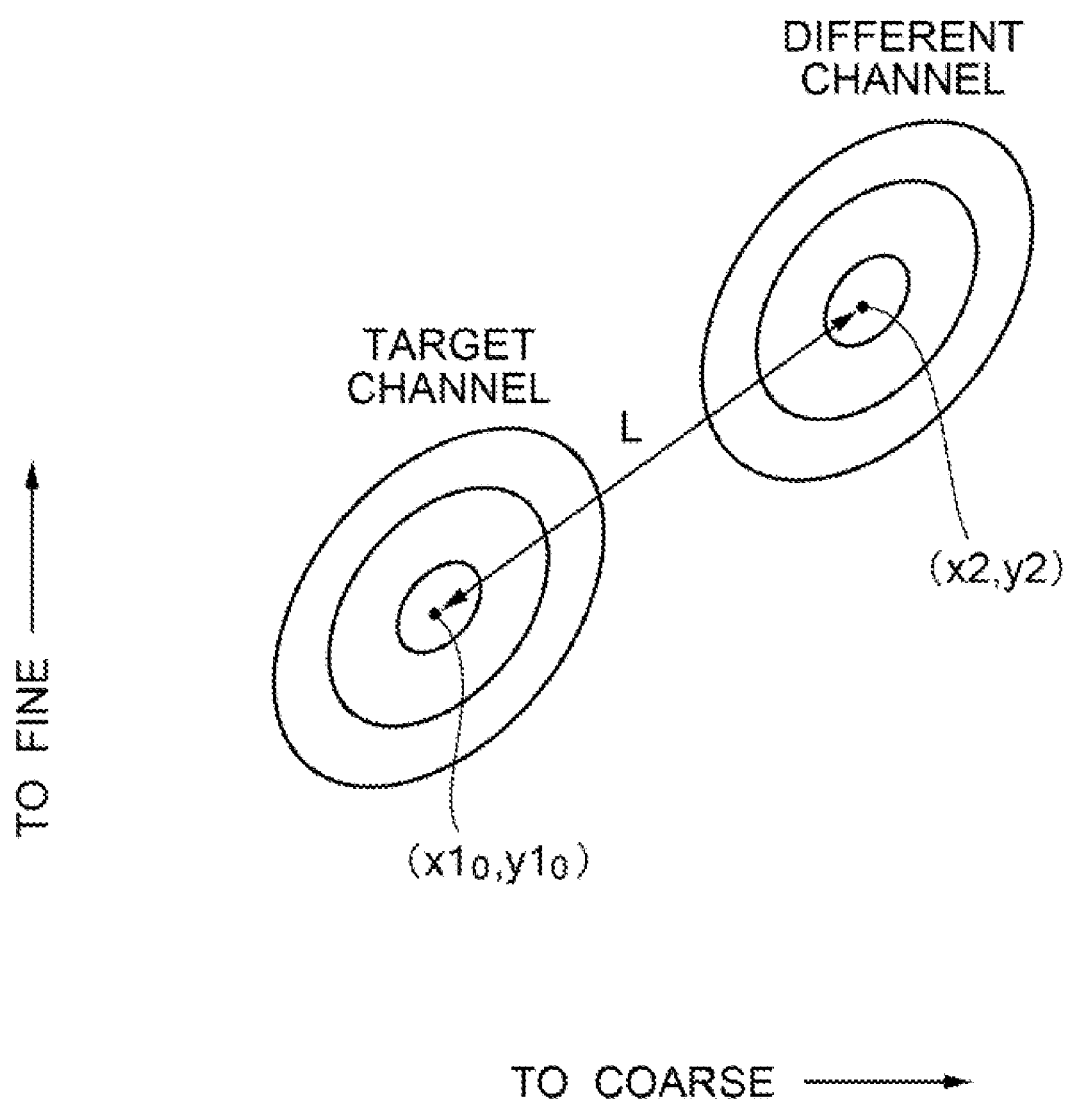
FIG. 10 is an explanatory chart showing a part of operations of a re-convergence judging module shown in FIG. 8.

FIG. 8 is a block diagram showing an example of the functional structure of the control unit of the variable wavelength light source 10 shown in FIG. 2. FIG. 9 is an explanatory chart showing a part of the operation of a plural combination creating module shown in FIG. 8. FIG. 10 is an explanatory chart showing a part of the operation of a re-convergence judging module shown in FIG. 8.

The control unit 18 includes: a light power adding module 18a which obtains the sum of the light powers detected by the light-receiving elements 21p-23p; and a variable light unit control module 18b which controls the heaters 22h and 23h in such a manner that the sum of the light powers obtained by the light power adding module 18a becomes the minimum. The variable light unit control module 18b includes a plural combination creating module 31, a second combination extracting module 32, a first combination creating module 33, an operation end judging module 34, a re-convergence judging module 35, and the like.

For a first combination of respective control input values for a plurality of variable light units, the plural combination creating module 31 creates a plurality of combinations by changing at least one control input value. The second combination extracting module 32 controls the plurality of variable light units according to the plurality of combinations and the first combination, and extracts the combination whose sum of the light powers detected by the photodetectors is the minimum as the second combination. The first combination creating module 33 brings each of the control input values of the first combination close to each of the control input values of the second combination, and outputs it to the plural combination creating module 31 as a new first combination.

As shown in FIG. 2, it is assumed here that the plurality of ring resonators are the ring resonators 21, 22, 23, the photodetectors are the light-receiving elements 21p, 22p, 23p provided to the respective throughports 11t, 25t, 27t of the ring resonators 21, 22, 23, and the plurality of variable light units are the heater 22h provided to the ring resonator 22 and the heater 23h provided to the ring resonator 23. On that condition, the plural combination creating module 31 has a function which creates a plurality of combinations by changing at least one input power value for the first combination of respective input power values for the heaters 22h and 23h.

The second combination extracting module 32 has a function which controls the heaters 22h, 23h according to the plurality of combinations and the first combination, and extracts the combination whose sum of the light powers detected by the light-receiving elements 21p-23p is the minimum as the second combination. The first combination creating module 33 has a function which brings each of the input power values of the first combination close to each of the input power values of the second combination, and outputs it to the plural combination creating module 31 as a new first combination.

Each module of such case may further be embodied as follows. As shown in FIG. 9, the plural combination creating module 31 has a function which creases eight combinations that are increased and decreased with a power amplitude of $\Delta P$, i.e., $(x1-\Delta P, y1-\Delta P)$, $(x1-\Delta P, y1)$, $(x1-\Delta P, y1+\Delta P)$, $(x1, y1+\Delta P)$, $(x1+\Delta P, y1+\Delta P)$, $(x1+\Delta P, y1)$, $(x1+\Delta P, y1-\Delta P)$, and $(x1, y1-\Delta P)$, for the first combination $(x1, y1)$ that is the combination of each of the input power values for the heaters 23h and 23h. The second combination extracting module 32 has a function which controls the heaters 22h, 23h according to the eight combinations and the first combination, and extracts the combination whose sum of the light powers detected by the light-receiving elements 21p-23p is the minimum as the second combination $(x2, y2)$.

The first combination creating module 33 has a wavelength switching function which takes $((x1+x2)/2, (y1+y2)/2)$, which is a half value of the sum of the values of each of the input powers of the second combination and the values of each of the input power of the first combination, as a new first combination, takes $\Delta P/2$ which is a half value of the power amplitude $\Delta P$ as a new power amplitude, and outputs the new first combination and the new power amplitude to the plural combination creating module 31. The operation end judging module 34 has a wavelength switching function which ends the operations of the plural combination creating module 31, the second combination extracting module 32, and the first combination creating module 33 when the new power amplitude becomes equal to or less than a specific value. Further, initial values of the first combination $(x1, y1)$ are determined in advance as values corresponding to the resonance wavelength of the multiple ring resonator 20.

Further, after operations of the plural combination creating module 31, the second combination extracting module 32, and the first combination creating module 33 are ended by the operation end judging module 34, the re-convergence judging module 35 takes $(x1_0-\Delta p\{(x2-x1_0)/L\}, y1_0-\Delta p\{(y2-y1_0)/L\})$ as the new first combination as shown in FIG. 10, takes the initial value of the power amplitude $\Delta P$ as a new power amplitude, and outputs the new first combination and the new power amplitude to the plural combination creating module 31, in a case where $L=\sqrt{\{(x2-x1_0)^2+(y2-y1_0)^2\}}$ which is a difference between the values of each of the input powers of the second combination and the initial values of each of the input powers of the first combination becomes equal to or more than a specific value when it is assumed that the initial values of the first combination $(x1, y1)$ are $(x1_0, y1_0)$ and the power value smaller than the initial value of the power amplitude $\Delta P$ is $\Delta p$.

Further, in addition to the wavelength switching function described above, the first combination creating module 34 has a steady-state function which takes $((x1+x2)/2, (y1+y2)/2)$ which is a half value of the sum of the values of each of the input powers of the second combination and the values of each of the input powers of the first combination as a new first combination, and outputs the new first combination to the plural combination creating module 31. In addition to the wavelength switching function described above, the first combination creating module 34 has the steady-state function which repeatedly executes the operations of the plural combination creating module 31, the second combination extracting module 32, and the first combination creating module 33.

Figure 11:
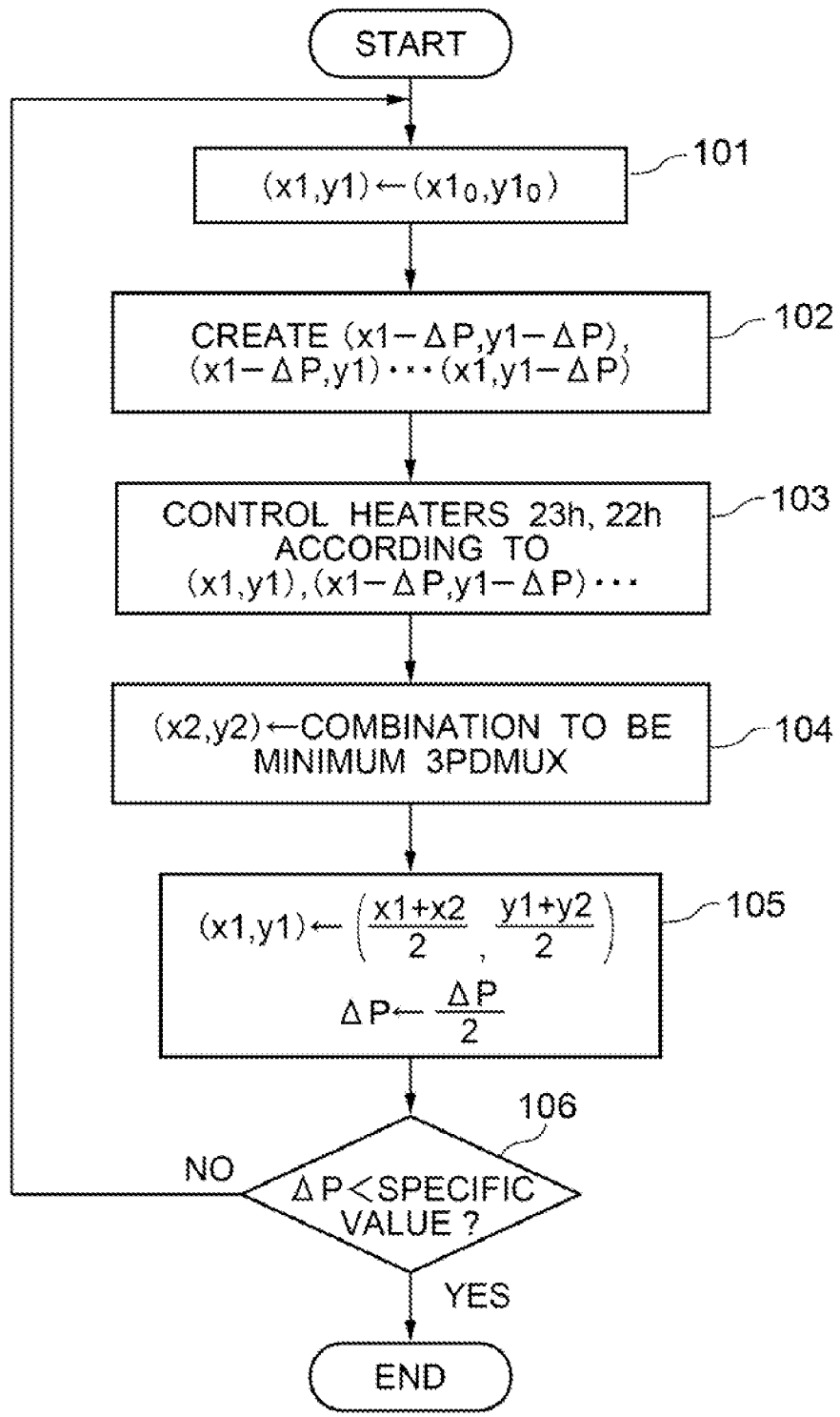
FIG. 11 is a flowchart showing an example of a wavelength switching operation executed by the control unit shown in FIG. 8.

FIG. 11 is a flowchart showing an example of the wavelength switching operation executed by the control unit 18 shown in FIG. 8. First, the initial values (x1$_0$, y1$_0$) set in advance as the values corresponding to the resonance wavelength of the multiple ring resonator 20 are inputted to be the first combination (x1, y1) (step 101). Subsequently, as shown in FIG. 9, eight combinations that are increased and decreased with a power amplitude of ΔP, i.e., (x1−ΔP, y1−ΔP), (x1−ΔP, y1), (x1−ΔP, y1+ΔP), (x1, y1+ΔP), (x1+ΔP, y1+ΔP), (x1+ΔP, y1), (x1+ΔP, y1−ΔP), and (x1, y1−ΔP), are created for the first combination (x1, y1) that is the combination of each of the input power values for the heaters 23h and 22h (step 102).

Subsequently, the heaters 23h and 22h are controlled according to the eight combinations and the first combination (step 103). At this time, the input powers to the heaters 23h and 22h are fixed to the values of each combination and the amount of the electricity supplied to the phase control region 17a is controlled to minimize the sum of the photocurrents of the light-receiving elements 21p-23p. Then, the combination with which the sum of the light powers detected by the light-receiving elements 21p-23p becomes the minimum is taken as the second combination (x2, y2) (step S104).

Subsequently, ((x1+x2)/2, (y1+y2)/2) which is a half value of the sum of the values of each of the input powers of the second combination and the values of each of the input power of the first combination is taken as the new first combination, and ΔP/2 which is a half value of the power amplitude ΔP is taken as the new power amplitude (step 105).

Subsequently, it is judged whether or not the new power amplitude becomes equal to or less than the specific value (step 106). When the new power amplitude is equal to or less than the specific value, it is judged that the target wavelength can be obtained. Thereby, the processing is ended. In the meantime, when the new power amplitude is not equal to or less than the specific value, the processing is returned to step 102 with the new first combination and the new power amplitude.

The wavelength switching operation estimates the position on the coordinates where there is likely to be the optimum input power value, and changes the input power concentratedly in the region of the vicinity thereof. Thus, the optimum input power value can be obtained efficiently in a short time. The combinations created in step 102 are not limited only to eight combinations, as long as there are a plurality of combinations. Further, the numerical value for dividing ΔP in step S105 is not limited only to "2" but may be any values as long as it is "1" or larger. The value may not have to be the same constantly but may be changed (e.g., may be decreased or increased gradually).

Figure 12:
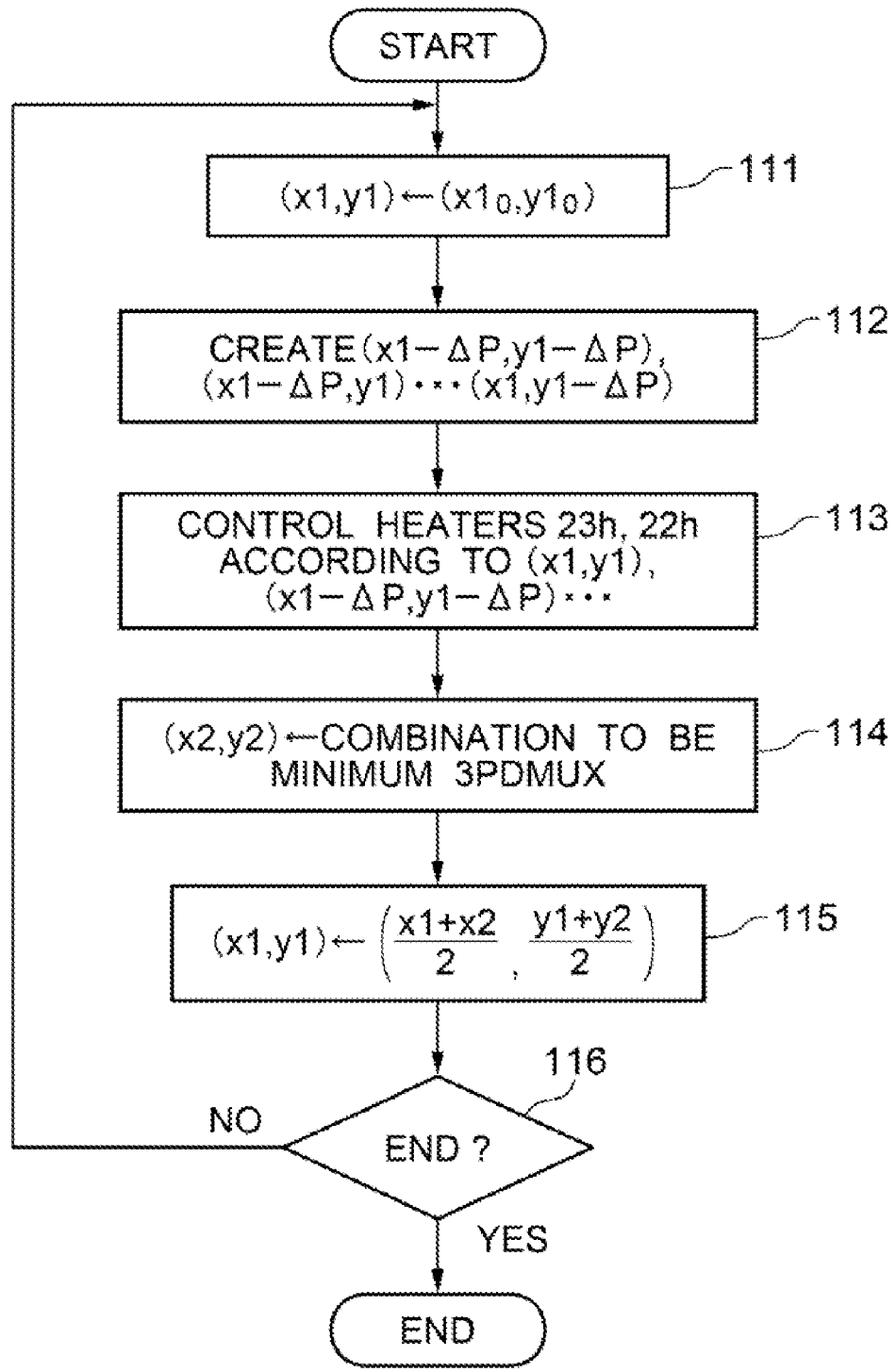
FIG. 12 is a flowchart showing an example of a steady-state operation executed by the control unit shown in FIG. 8.

FIG. 12 is a flowchart showing an example of the steady-state operation executed by the control unit 18 shown in FIG. 8. First, the initial values (x1$_0$, y1$_0$) set in advance as the values corresponding to the resonance wavelength of the multiple ring resonator 20 obtained by the wavelength switching operation shown in FIG. 11 are inputted to be the first combination (x1, y1) (step 111). Subsequently, as shown in FIG. 9, eight combinations that are increased and decreased with a power amplitude of ΔP, i.e., (x1−ΔP, y1−ΔP), (x1−ΔP, y1), (x1−ΔP, y1+ΔP), (x1, y1+ΔP), (x1+ΔP, y1+ΔP), (x1+ΔP, y1), (x1+ΔP, y1−ΔP), and (x1, y1−ΔP), are created for the first combination (x1, y1) that is the combination of each of the input power values for the heaters 23h and 22h (step 112).

Subsequently, the heaters 23h and 22h are controlled according to the eight combinations and the first combination (step 113). At this time, the input powers to the heaters 23h and 22h are fixed to the values of each combination and the amount of the electricity supplied to the phase control region 17a is controlled to minimize the sum of the photocurrents of the light-receiving elements 21p-23p. Then, the combination which the sum of the light powers detected by the light-receiving elements 21p-23p becomes the minimum is taken as the second combination (x2, y2) (step S114).

Subsequently, ((x1+x2)/2, (y1+y2)/2) which is a half value of the sum of the values of each of the input powers of the second combination and the values of each of the input power of the first combination is taken as the new first combination, and the processing is returned to step 111 (step 115). Thereby, steps 112-115 described above are repeated. A following step may also be added.

The operations of steps 112-115 are repeatedly executed, and the operations thereof are ended upon receiving an ending instruction (step 116).

The steady-state operation estimates the position on the coordinates where there is likely to be the optimum input power value, and changes the input power concentratedly in the region of the vicinity thereof. Thus, the optimum input power value can be obtained efficiently in a short time. Further, through repeating steps 112-115 at all times during the operations of the variable wavelength light source 10, it becomes possible to deal with chronological changes in the optimum values of the input power. The combinations created in step 112 are not limited only to eight combinations, as long as there are a plurality of combinations.

Figure 13:
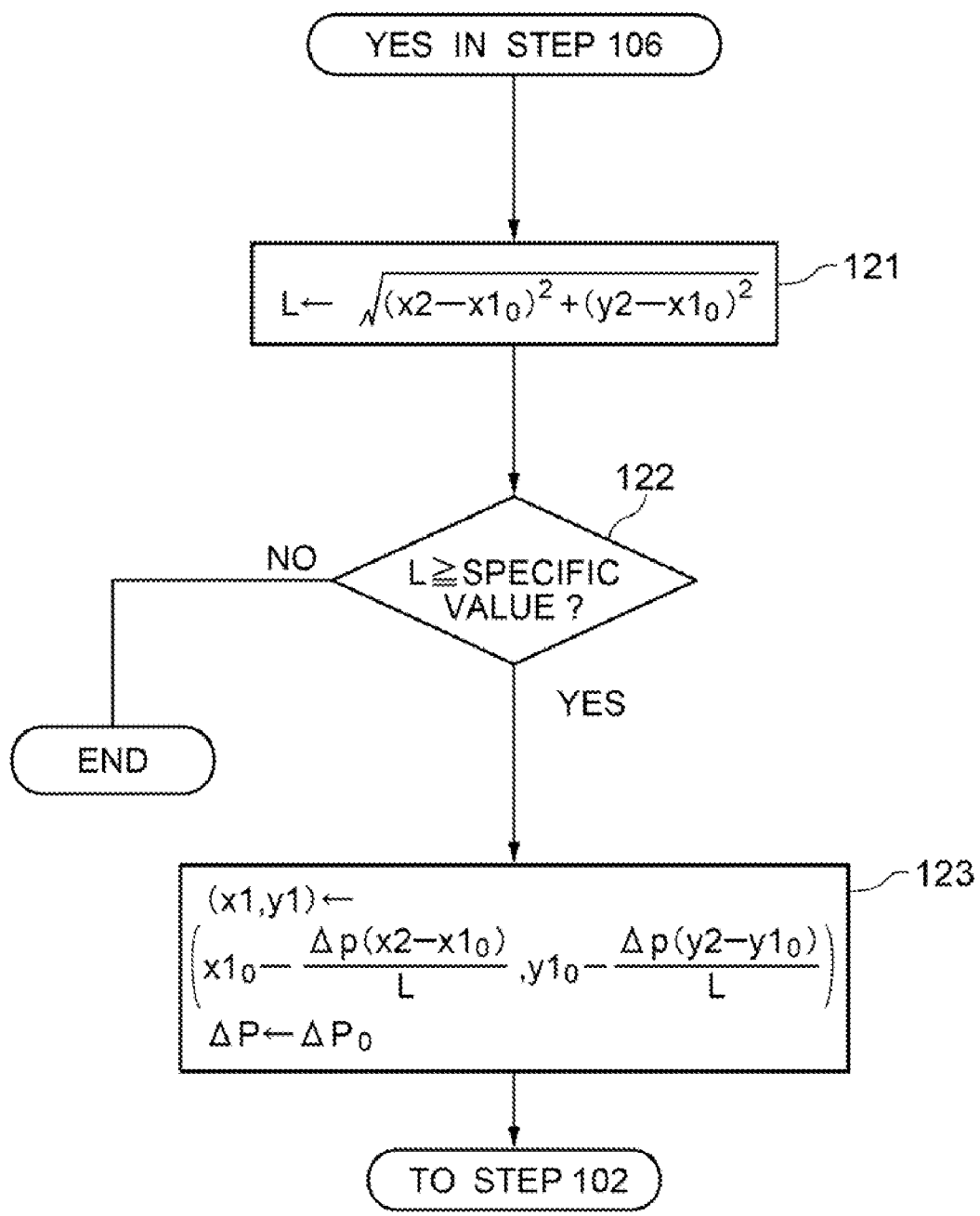
FIG. 13 is a flowchart showing an example of a re-convergence operation executed by the control unit shown in FIG. 8.

FIG. 13 is a flowchart showing an example of the re-convergence operation of the control unit 18 shown in FIG. 8. In a case where it is "Yes" in step 106 of FIG. 11, the following re-convergence operation may be added. Note here that the initial values of the first combination (x1, y1) are (x1$_0$, y1$_0$) and the power value smaller than the initial value ΔP$_0$ of the power amplitude ΔP is Δp.

First, as shown in FIG. 10, L=√{(x2−x1$_0$)$^2$+(y2−y1$_0$)$^2$} which is a difference between the values of each of the input powers of the second combination and the initial values of each of the input powers of the first combination is obtained (step 121). Then, it is judged whether or not L is equal to or more than a specific value (step 122). When L is less than the specific value, it is judged to have been converged to the target wavelength channel. Thereby, the processing is ended. In the meantime, when L is equal to or more than the specific value, it is judged to have been converged to another wavelength channel. Thus, (x1$_0$−Δp{(x2−x1$_0$)/L}, y1$_0$−Δp{y2−y1$_0$)/L}) is taken as the new first combination and the initial value of the power amplitude ΔP is taken as the new power amplitude (step 123). Then, the procedure is advanced to step 102 with the new first combination and the new power amplitude.

When judged "Yes" in step 122, it is judged that there is an occurrence of such error that it has converged to a wavelength channel that is not the target wavelength channel. As a cause for the error, it is considered that the initial values (x1$_0$, y1$_0$) in step 101 of FIG. 11 are too close to the final values of the second combination of another wavelength channel. Thus, operations of step 102 and thereafter in FIG. 11 are executed by taking the point shifted from the initial values (x1$_0$, y1$_0$) towards the direction away from the final values of the second combination as the first combination. As described, with the re-convergence operation, it is possible to converge to the target wavelength channel precisely even if it has once converged to a wavelength channel that is not the target wavelength channel.

The processing according to each of the steps shown in FIG. 11-FIG. 13 is the operation itself of the variable wavelength light source 10, and it can be implemented as a program for causing the microcomputer 40 to function as each of the modules of the control unit 18.

While the variable wavelength light source 10 is formed with the ring resonators 21-23 in the exemplary embodiment described above, the number of coupled resonators is not limited only to "3". There may be two resonators or four or more resonators. Each of the resonators can also be directly coupled only with the directional coupler.

The light input/output unit is not limited only to the SOA but may also be an optical fiber amplifier or the like. The variable light unit is not limited only to the heater which changes the wavelength with heat but may also be those which change the wavelength electrically or mechanically. The number of the variable light units is not limited only to "2" but may also be "3" or more. It is also possible to optically obtain the sum of the light powers detected by each of the light-receiving elements, and omit the light power adding module.

The case of building the present invention as the variable light source is described in the exemplary embodiment above. However, it is also possible to build it as an optical module by using the variable wavelength light source shown in FIG. 2. In that case, as shown in FIG. 2, the optical module is built as the structure which includes the variable wavelength light source, a case 100 to which the variable wavelength light source is housed, and a light guide unit 101 which guides the light emitted from the variable wavelength light source towards the outside the case 100.

As shown in FIG. 2, the variable wavelength light source may be formed as a structure which includes: a multiple resonator 20 including a plurality of ring resonators 21, 22, and 23 having throughports 11t, 25t, and 27t, which have different optical path lengths from each other and are coupled mutually; a plurality of photodetectors 21p, 22p, and 23p which detect light powers outputted from the plurality of ring resonators 21, 22, and 23 via the respective throughports 11t, 25t, and 27t; a plurality of variable light units 22h and 23h for changing the transmittance of the multiple ring resonator 20 by individually working on the plurality of ring resonators; a light input/output unit 17 which supplies the light to the multiple resonator and emits the light returned from the multiple resonator towards the outside; a control unit 18 which controls the plurality of variable light units based on the light powers detected by the photodetectors 21p, 22p, and 23p; and light attenuators 92 and 93 provided between the throughports and the photodetectors 21p, 22p, 23p for attenuating the light emitted from the throughports before making incident on the photodetectors.

While the present invention has been described by referring to specific embodiments shown in the drawings, the present invention is not limited only to those embodiments shown in the drawings. It is to be understood that any known structures can be employed as long as the effects of the present invention can be achieved therewith.

The present invention can contribute to acquire a stable output light wavelength without having wavelength jumping through avoiding such a phenomenon that a specific throughport with an extremely large output becomes dominant in the synthesizing property.

The invention claimed is:

1. A variable wavelength light source, comprising:
   a multiple resonator including a plurality of ring resonators having throughports, which have different circumference lengths from each other and are coupled mutually;
   a plurality of photodetectors which detect light powers outputted via the respective throughports of the plurality of ring resonators;
   a plurality of variable light units for changing transmittance of the multiple resonator by individually working on the plurality of resonators;
   a light input/output unit which supplies light to the multiple resonator and emits light returned from the multiple resonator towards outside;
   a control unit which controls the plurality of variable light units based on the light powers detected by the photodetectors; and
   light attenuators provided between the throughports and the photodetectors for attenuating the light emitted from the throughports before making incident on the photodetectors.

2. The variable wavelength light source as claimed in claim 1, wherein the control unit comprises:
   a light power adding module which obtains a sum of the light powers detected by the plurality of photodetector light receiving elements; and a variable light unit control module which controls the plurality of variable light units in such a manner that a sum of the light powers obtained by the light power adding module becomes minimum.

3. The variable wavelength light source as claimed in claim 1, wherein the light attenuator attenuates the light emitted from the throughports before the light makes incident on each of the light-receiving elements, so that the light powers detected by each of the light-receiving elements configuring the photodetectors become substantially equal.

4. The variable wavelength light source as claimed in claim 3, wherein the light attenuator includes at least one selected from a coupling waveguide, a crossing waveguide, a gap module, and an axis-shift module.

5. The variable wavelength light source as claimed in claim 3, wherein the light attenuator is formed with a coupling waveguide which branches the light emitted from the throughport into a plurality of output systems, and the light of one system out of the plurality of output systems is guided to the photodetectors, and the light of the systems not guided to the photodetectors is released to the outside.

6. The variable wavelength light source as claimed in claim 3, wherein the variable light unit control module comprises:
   a plural combination creating module which creates a plurality of combinations by changing at least one control input value regarding a first combination of respective control input values for the plurality of variable light units;
   a second combination extracting module which controls the plurality of variable light units according to the plurality of combinations and the first combination, and extracts a combination whose sum of the light powers detected by the plurality of light-receiving elements is the minimum as a second combination; and
   a first combination creating module which brings each of the control input values of the first combination close to each of the control input values of the second combination, and outputs it to the plural combination creating module as a new first combination.

7. The variable wavelength light source as claimed in claim 6, wherein:
   the plurality of variable light units are respective heaters provided to the plurality of ring resonators;
   the plural combination creating module has a function which creates a plurality of combinations by changing at least one input power value regarding a first combination of respective input power values for the plurality of heaters;

the second combination extracting module has a function which controls the plurality of heaters according to the plurality of combinations and the first combination, and extracts a combination whose sum of the light powers detected by the plurality of light-receiving elements is the minimum as a second combination; and the first combination creating module has a function which brings each of the control input values of the first combination close to each of the control input values of the second combination, and outputs it to the plural combination creating module as a new first combination.

8. An optical module, comprising a variable wavelength light source, a case in which the variable wavelength light source is housed, and a light guide unit which guides light emitted from the variable wavelength light source towards outside the case, wherein the variable wavelength light source comprises:

a multiple resonator including a plurality of ring resonators having throughports, which have different circumference lengths from each other and are coupled mutually;

a plurality of photodetectors which detect light powers outputted via the respective throughports of the plurality of ring resonators;

a plurality of variable light units for changing transmittance of the multiple resonator by individually working on the plurality of ring resonators;

a light input/output unit which supplies light to the multiple resonator and emits light returned from the multiple resonator towards outside;

a control unit which controls the plurality of variable light units based on the light powers detected by the photodetectors; and light attenuators provided between the throughports and the photodetectors for attenuating the light emitted from the throughports before making incident on the photodetectors.

9. A method for controlling a variable wavelength light source which comprises:

a multiple resonator including a plurality of ring resonators which have different circumference lengths from each other and are coupled mutually;

a plurality of light-receiving elements which detect light powers outputted via respective throughports of the plurality of resonators at the respective throughports;

a plurality of variable light units for changing transmittance of the multiple resonator by individually working on at least two of the plurality of resonators; and a light input/output unit which supplies light to the multiple resonator and emits light returned from the multiple resonator towards outside, the variable wavelength light source controlling the plurality of variable light units in such a manner that a sum of the light powers detected by the plurality of light-receiving elements becomes minimum, the method comprising attenuating the light emitted from the throughports before making incident on the plurality of light-receiving elements.

10. The method for controlling the variable wavelength light source as claimed in claim 9, comprising attenuating the light emitted from the throughports so that the light powers detected by each of the light-receiving elements become substantially equal.

11. The method for controlling the variable wavelength light source as claimed in claim 10, comprising:

branching the light emitted from the throughport into a plurality of output systems; and guiding the light of one system out of the plurality of output systems to the light-receiving elements, and releasing the light of the systems not guided to the light-receiving elements to the outside the variable wavelength light source.

12. A variable wavelength light source, comprising:

a multiple resonator including a plurality of ring resonators having throughports, which have different circumference lengths from each other and are coupled mutually;

a plurality of photodetecting means for detecting light powers outputted via the respective throughports of the plurality of ring resonators;

a plurality of variable light means for changing transmittance of the multiple resonator by individually working on the plurality of resonators;

a light input/output means for supplying light to the multiple resonator and emitting light returned from the multiple resonator towards outside;

control means for controlling the plurality of variable light means based on the light powers detected by the photodetecting means; and light attenuating means provided between the throughports and the photodetecting means for attenuating the light emitted from the throughports before making incident on the photodetecting means.

13. An optical module, comprising a variable wavelength light source, a case in which the variable wavelength light source is housed, and light guide means for guiding light emitted from the variable wavelength light source towards outside the case, wherein the variable wavelength light source comprises:

a multiple resonator including a plurality of ring resonators having throughports, which have different circumference lengths from each other and are coupled mutually;

a plurality of photodetecting means for detecting light powers outputted via the respective throughports of the plurality of ring resonators;

a plurality of variable light means for changing transmittance of the multiple resonator by individually working on the plurality of ring resonators;

light input/output means for supplying light to the multiple resonator and emitting light returned from the multiple resonator towards outside;

control means for controlling the plurality of variable light means based on the light powers detected by the photodetecting means; and light attenuating means provided between the throughports and the photodetecting means for attenuating the light emitted from the throughports before making incident on the photodetecting means.

* * * * *